United States Patent [19]
Shone et al.

[11] Patent Number: 5,618,742
[45] Date of Patent: Apr. 8, 1997

[54] METHOD OF MAKING FLASH EPROM WITH CONDUCTIVE SIDEWALL SPACER CONTACTING FLOATING GATE

[75] Inventors: Fuchia Shone, Hsinchu, Taiwan; Tom D.-H. Yiu, Milpitas; Tien-Ler Lin, Cupertino, both of Calif.

[73] Assignee: Macronix Internatioal, Ltd., Hsinchu, Taiwan

[21] Appl. No.: 329,487

[22] Filed: Oct. 26, 1994

Related U.S. Application Data

[63] Continuation-in-part of Ser. No. 187,118, Jan. 25, 1994, Pat. No. 5,399,891, which is a continuation of Ser. No. 823,892, Jan. 22, 1992, Pat. No. 5,341,468.

[51] Int. Cl.$^6$ ............................................... H01L 21/8247
[52] U.S. Cl. ........................... 438/263; 438/267; 438/264
[58] Field of Search ................................. 437/43, 48, 52

[56] References Cited

U.S. PATENT DOCUMENTS

| | | |
|---|---|---|
| 4,258,378 | 3/1981 | Wall . |
| 4,639,893 | 1/1987 | Eitan . |
| 4,698,787 | 10/1987 | Mukherjee et al. . |
| 4,780,424 | 10/1988 | Holler et al. . |
| 4,792,925 | 12/1988 | Corda et al. . |

(List continued on next page.)

FOREIGN PATENT DOCUMENTS

| | | |
|---|---|---|
| 0298430A2 | 1/1989 | European Pat. Off. . |
| 0422347A2 | 9/1989 | European Pat. Off. . |
| 0354858A1 | 2/1990 | European Pat. Off. . |
| 0461764A2 | 6/1990 | European Pat. Off. . |
| 0386631A2 | 9/1990 | European Pat. Off. . |
| 0461764A3 | 12/1991 | European Pat. Off. . |
| 0552531A1 | 7/1993 | European Pat. Off. . |
| 13832641 | 3/1989 | Germany . |
| 2241380A | 11/1990 | United Kingdom . |

OTHER PUBLICATIONS

M. Okada, et al., "16 Mb ROM Design using Bank Select Architecture" IEEE Symposium on VLSI Circuits, Tokyo, 1988, month unknown.

W. Kammerer, et al., "A New Virtual Ground Array Architecture for Very High Speed, High Density EPROMS", IEEE Symposium on VLSI Circuits, OISO, May 1991, pp. 83–84.

(List continued on next page.)

*Primary Examiner*—John Niebling
*Assistant Examiner*—Richard A. Booth
*Attorney, Agent, or Firm*—Wilson Sonsini Goodrich & Rosati

[57] ABSTRACT

Contactless flash EPROM cell and array designs, and methods for fabricating the same result in dense, segmentable flash EPROM chips. Also, an extended floating gate structure, and method for manufacturing the extended floating gate allow for higher capacitive coupling ratios in flash EPROM circuitry with very small design rules. The floating gates are extended in a symmetrical fashion in a drain-source-drain architecture, so that each pair of columns of cells has a floating gate which is extended in opposite directions from one another. This allows one to take advantage of the space on the cell normally consumed by the isolation regions, to extend the floating gates without increasing the layouts of the cells. Also, an easily scalable design is based on establishing conductive spacers on the sides of floating gate deposition layers which are used for self-alignment of the source and drain. According to this structure, a floating gate deposition is first laid down and used for establishing self-aligned source and drain diffusion regions. After deposition of the source and drain, conductive spacers are deposited on the sides of the first floating gate structure. These conductive spacers can be deposited in a symmetrical fashion, and are easily scalable to large scale arrays of flash EPROM designs.

10 Claims, 17 Drawing Sheets

U.S. PATENT DOCUMENTS

| | | |
|---|---|---|
| 4,947,378 | 8/1990 | Jinbo et al. . |
| 4,949,309 | 8/1990 | Rao et al. . |
| 4,972,378 | 11/1990 | Kitigawa et al. . |
| 4,994,403 | 2/1991 | Gill et al. . |
| 5,012,446 | 4/1991 | Bergemont . |
| 5,019,879 | 5/1991 | Chiu . |
| 5,021,848 | 6/1991 | Chiu . |
| 5,023,681 | 11/1991 | Ha . |
| 5,023,837 | 6/1991 | Schreck et al. . |
| 5,028,979 | 7/1991 | Mazzali . |
| 5,045,489 | 9/1991 | Gill et al. . |
| 5,051,795 | 9/1991 | Gill et al. . |
| 5,060,195 | 10/1991 | Gill et al. . |
| 5,095,461 | 3/1992 | Miyakawa et al. . |
| 5,110,753 | 5/1992 | Gill et al. . |
| 5,111,428 | 5/1992 | Liang et al. . |
| 5,127,739 | 7/1992 | Duvvury et al. . |
| 5,168,335 | 12/1992 | D'Arrigo et al. . |
| 5,204,835 | 4/1993 | Eitan . |
| 5,229,968 | 7/1993 | Ito et al. . |
| 5,245,570 | 9/1993 | Fazio et al. . |
| 5,315,541 | 5/1994 | Harari et al. . |
| 5,453,391 | 9/1995 | Yiu et al. ................ 437/43 |

OTHER PUBLICATIONS

Eitan, et al., "Alternate Metal Virtual Ground (AMG)—A New Scaling Concept for Very High–Density EPROM's"; IEEE Electron Device Letters, vol. 12, No. 8, Aug. 1991, pp. 450–452.

H. Pein, et al., "A 3–D Sidewall Flash EPROM Cell and Memory Array"; IEEE Electron Device Letters, vol. 14, No. 8, Aug. 1993, pp. 415–417.

H. Pein, et al., "Performance of the 3–D Sidewall Flash EPROM Cell"; IEEE, 1993, no month provided.

S. Yamada, et al., "Degradation Mechanism of Flash EEPROM Programming After Program/Erase Cycles"; IEEE 1993, no month provided.

H. Kume, et al., "A 1.28 $\mu m^2$ Contactless Memory Cell Technology for a 3V–Only 64Mbit EEPROM"; IEDM 1992, no month provided.

A. Bergemont, et al., "NOR Virtual Ground (NVG)—A New Scaling Concept for Very High Density FLASH EEPROM and its Implementation in a 0.5 $\mu m$ Process"; IEEE, 1993, no month provided.

H. Onoda, et al., "A Novel Cell Structure Suitable for a 3 Volt Operation, Sector Erase and Flash Memory"; IEEE, 1992, no month provided.

R Kazerounian, et al., "Alternate Metal Virtual Ground EPROM Array Implemented in a 0.8 $\mu m$ Process for Very High Density Applications"; IEEE 1991, pp. 11.5.1–11.5.4, no month provided.

M. McConnell, et al., "An Experimental 4–Mb Flash EEPROM with Sector Erase" Journal of Solid Circuits, vol. 26, No. 4; Apr. 1991; pp. 484–489.

FIG.—3

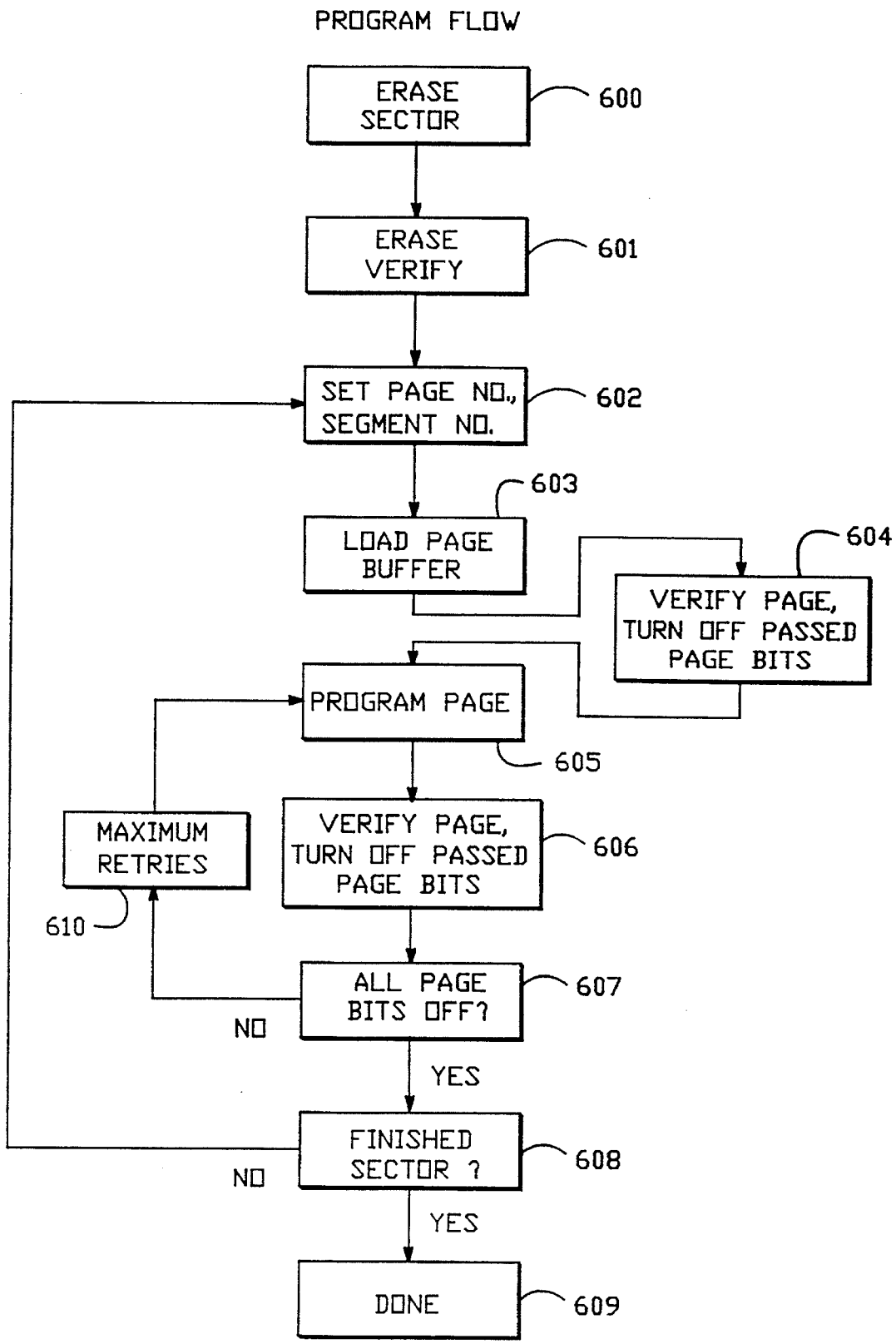
FIG.—4A

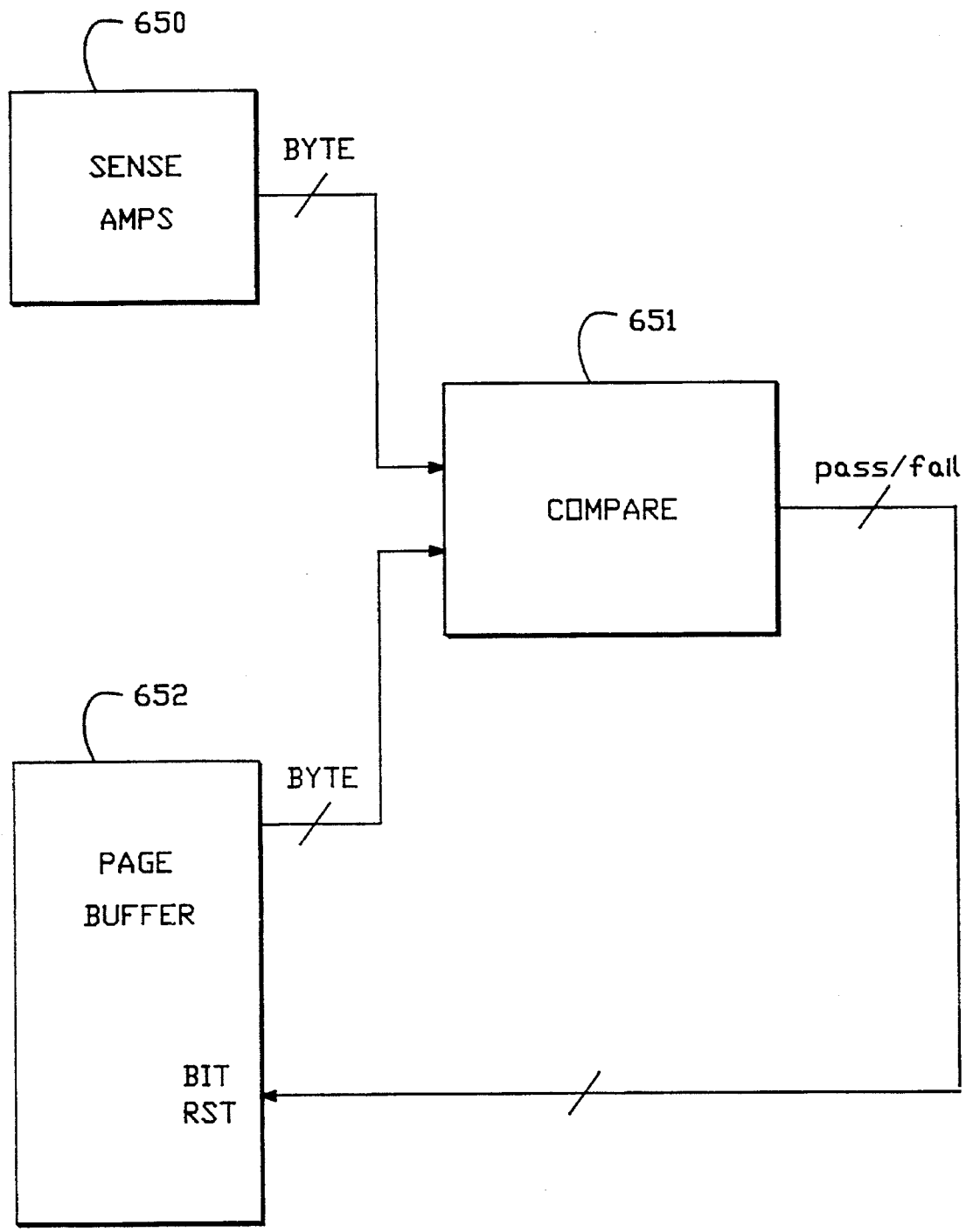
FIG.—4B

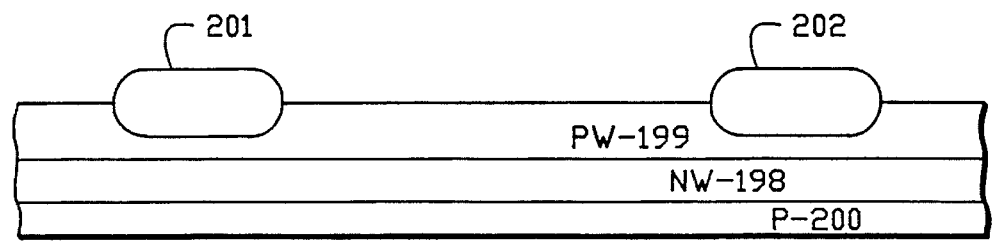
FIG.—5A
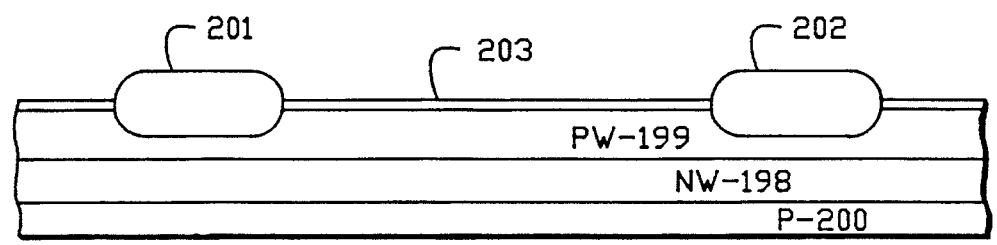
FIG.—5B
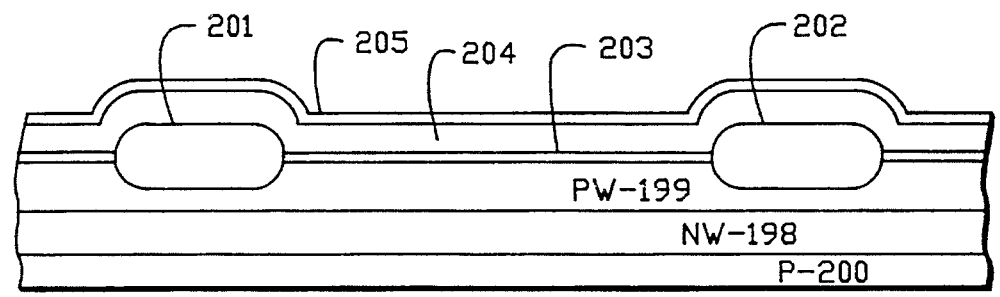
FIG.—5C
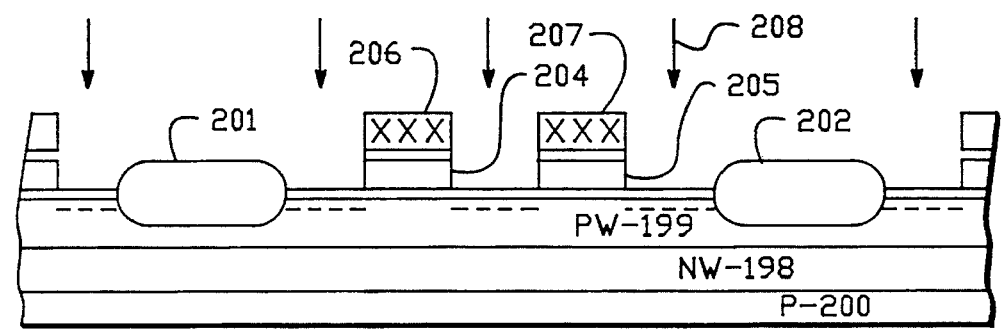
FIG.—5D

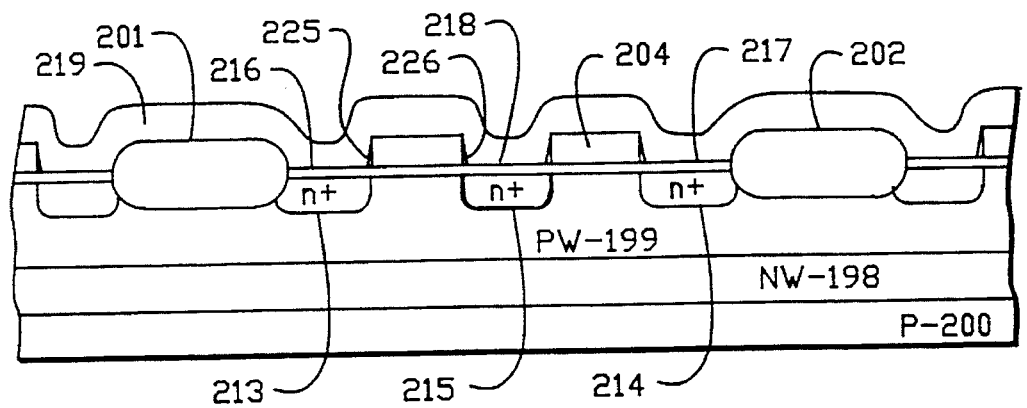
FIG.—5E
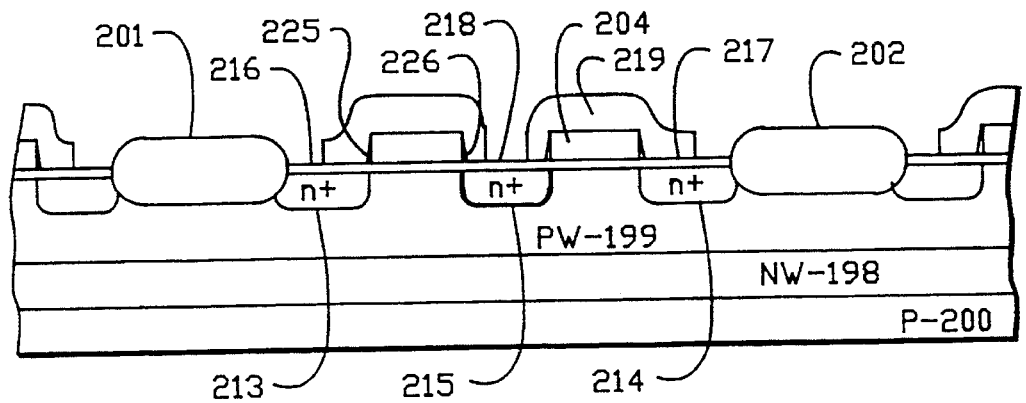
FIG.—5F
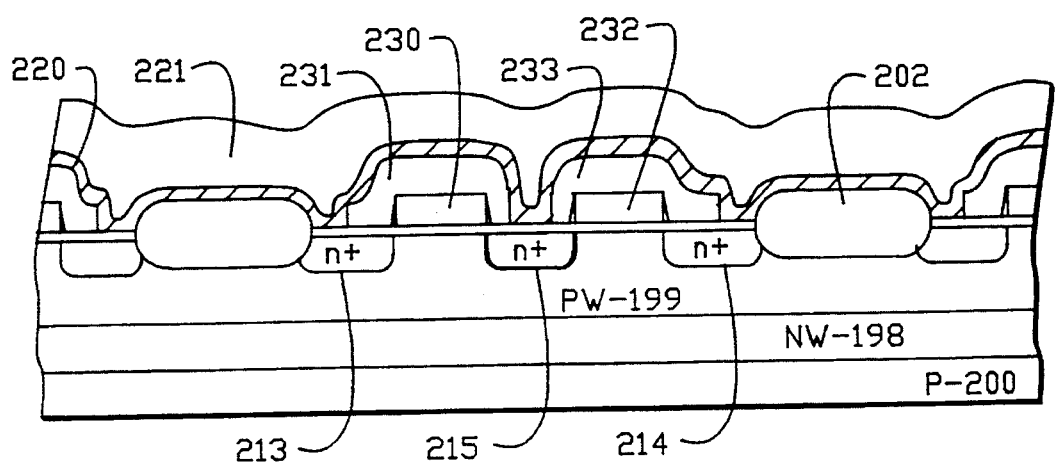
FIG.—5G

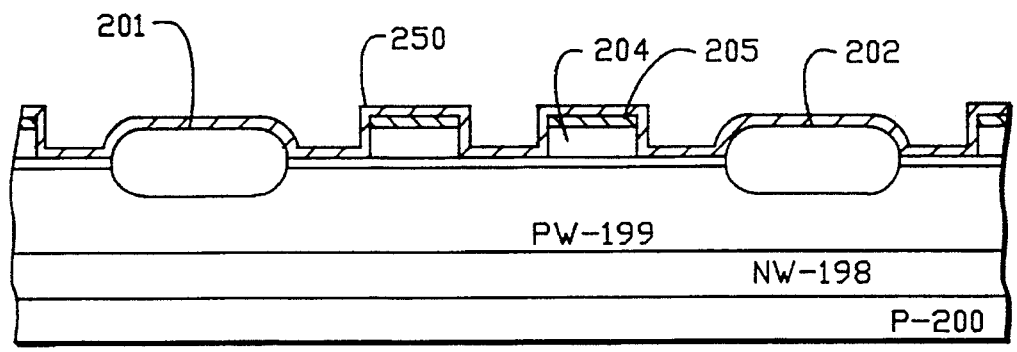
FIG.—6A
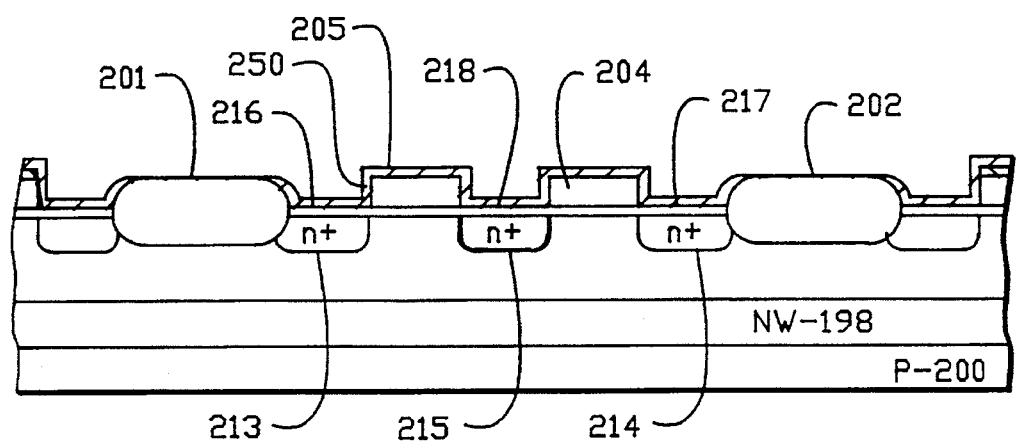
FIG.—6B
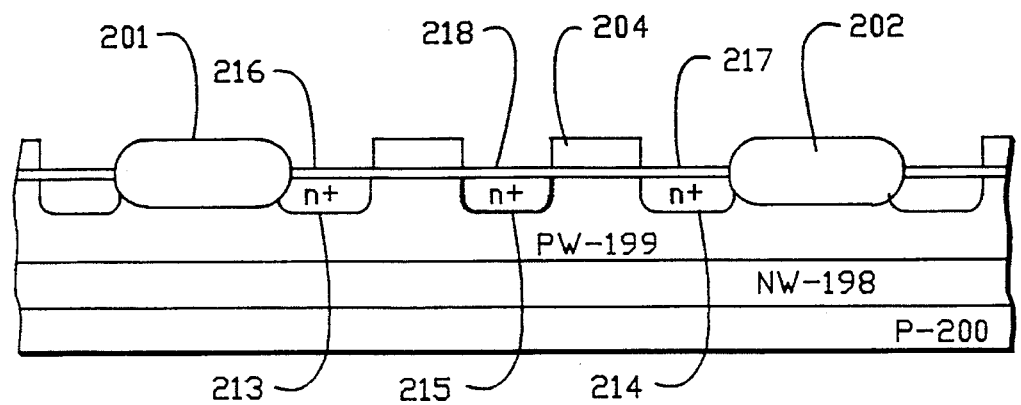
FIG.—6C

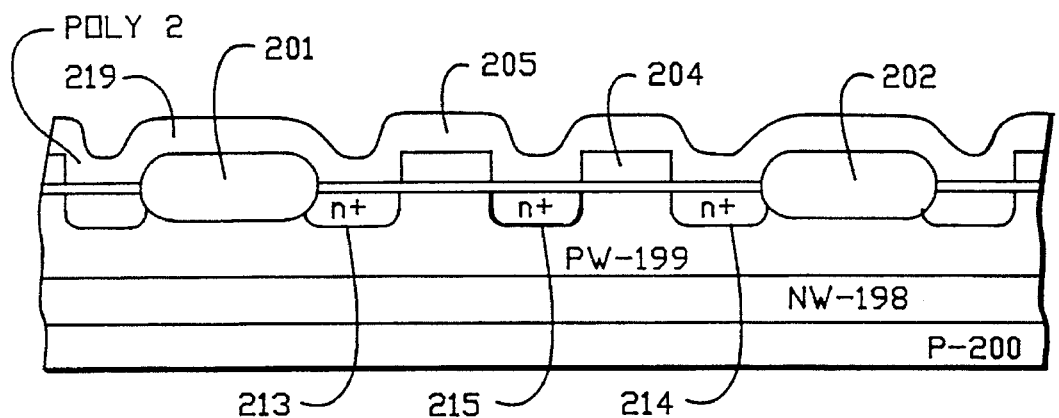
FIG.—6D
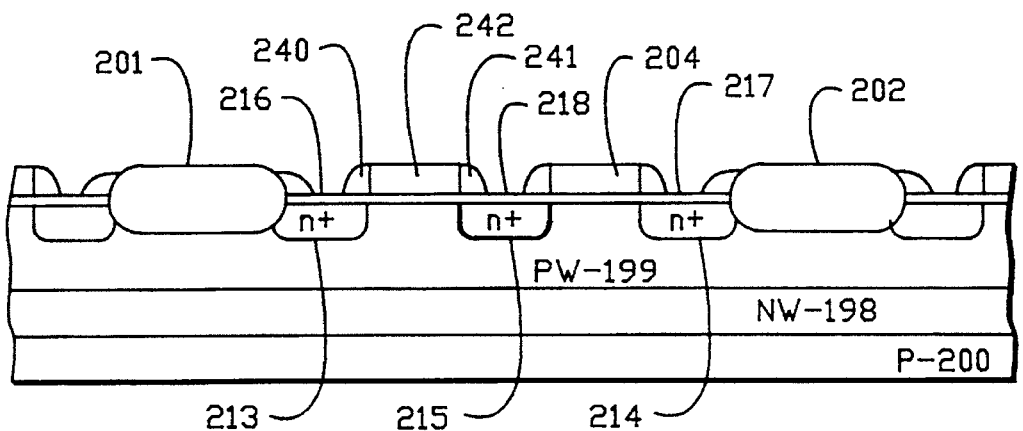
FIG.—6E
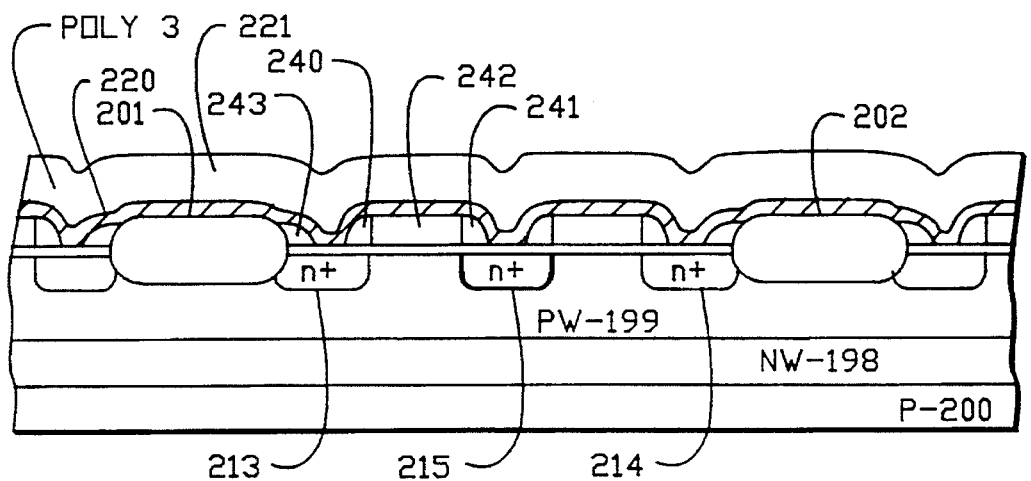
FIG.—6F

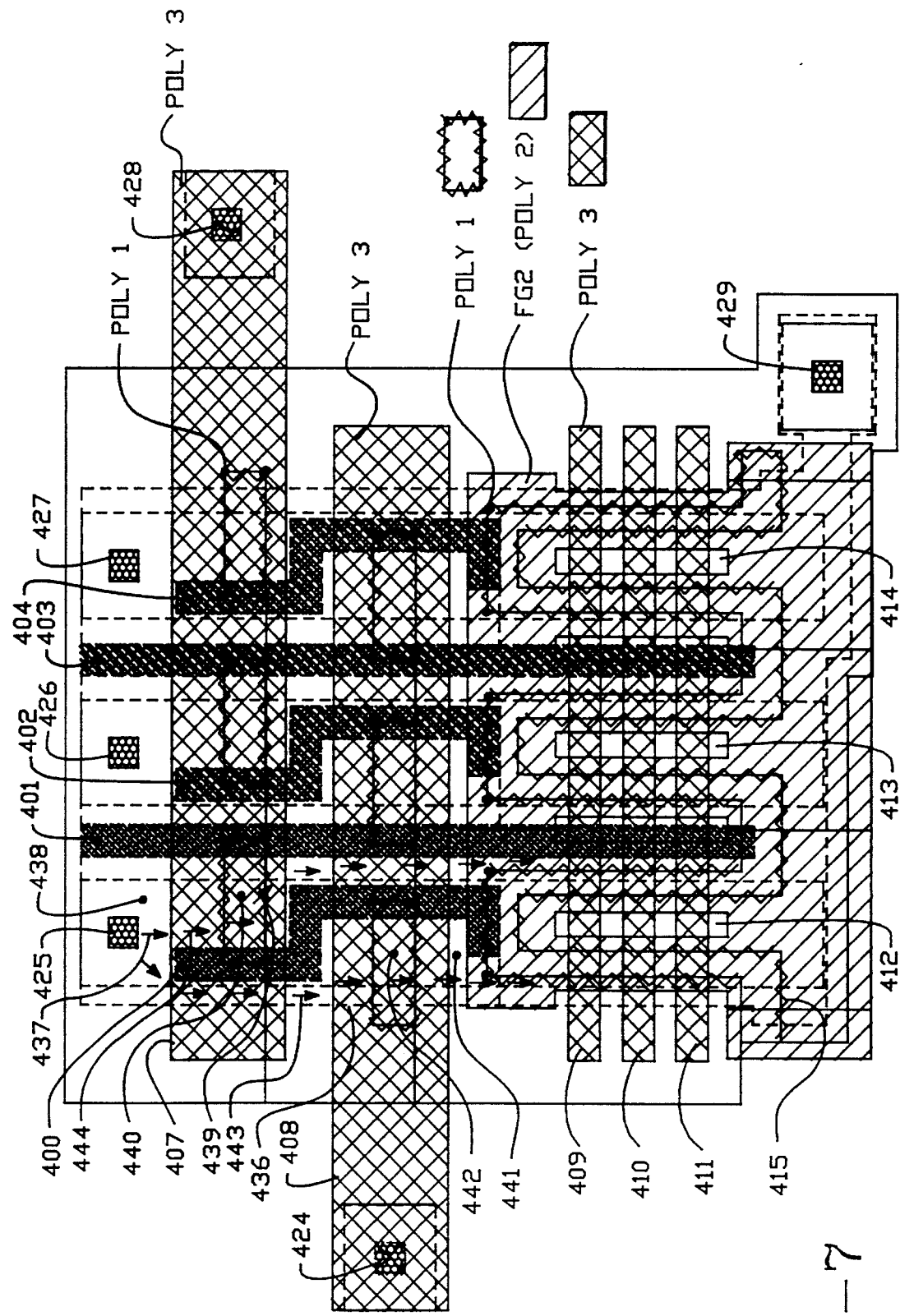
FIG.—7

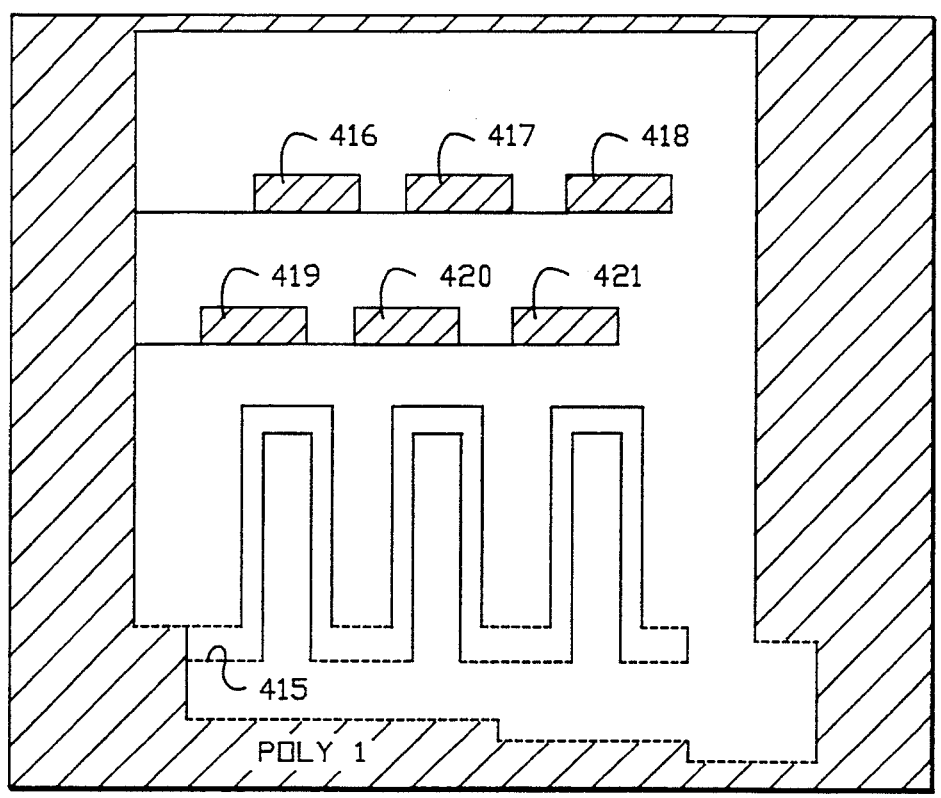
FIG.—10
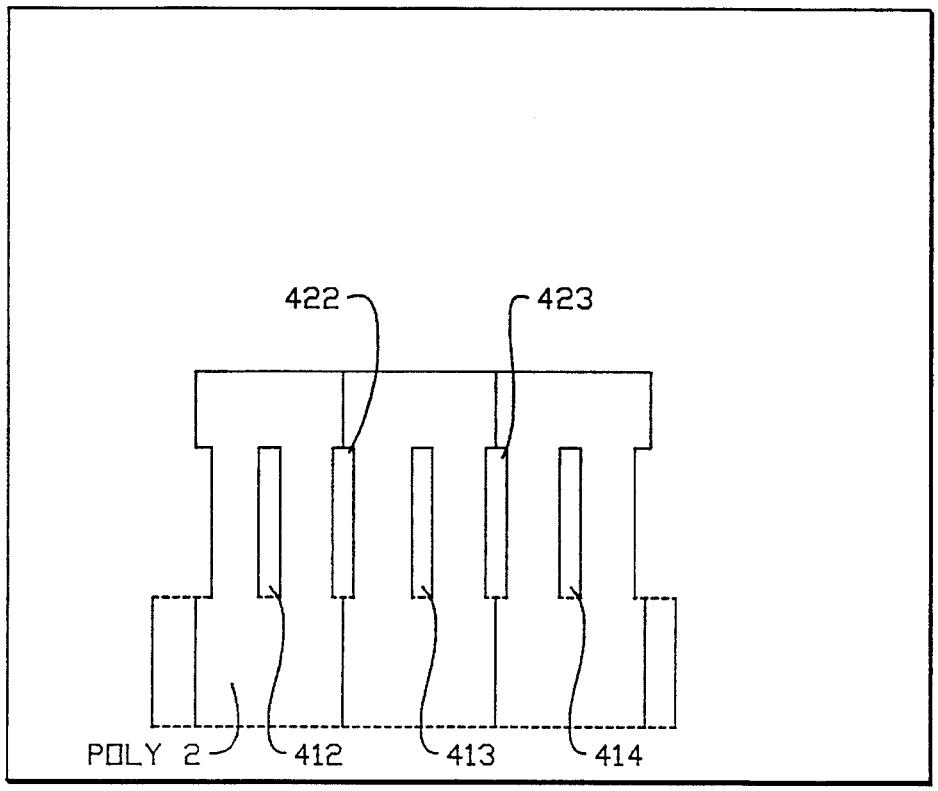
FIG.—11

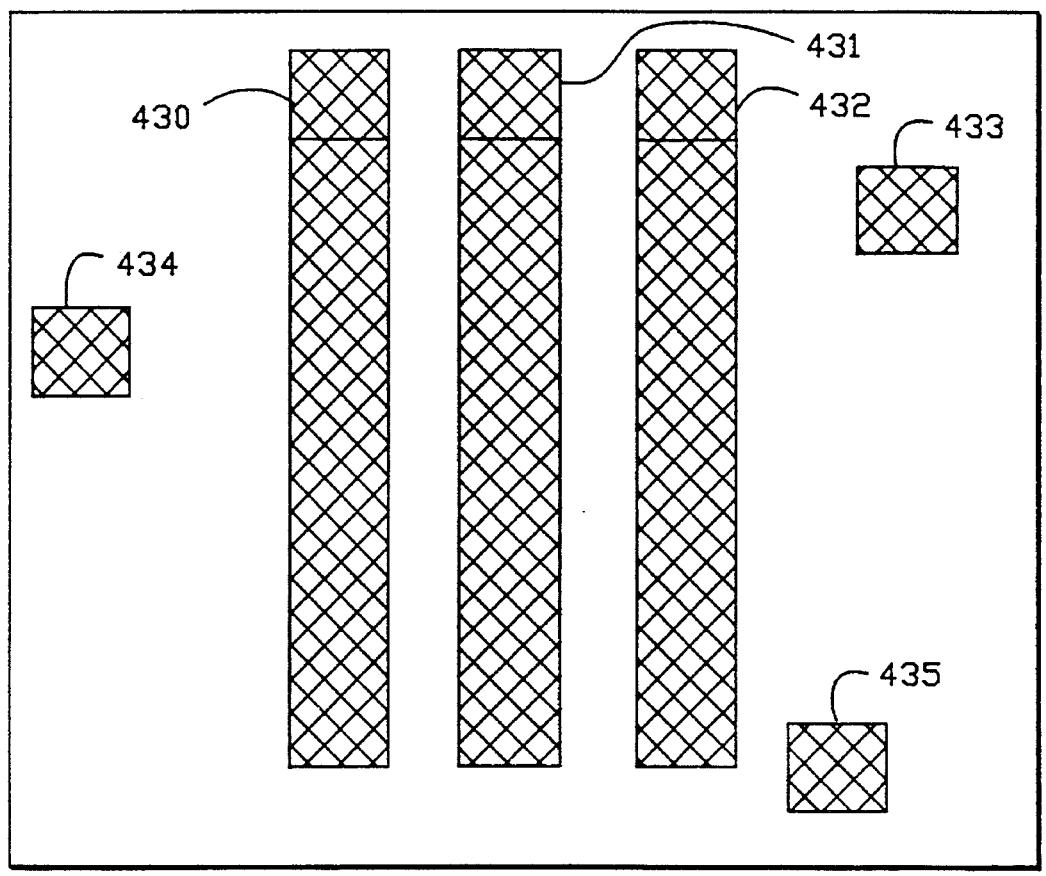
FIG.—14

METHOD OF MAKING FLASH EPROM WITH CONDUCTIVE SIDEWALL SPACER CONTACTING FLOATING GATE

CONTINUATION APPLICATION DATA

The present application is a continuation-in-part of prior filed U.S. application No. 08/187,118, filed 25 Jan. 1994, now U.S. Pat. No. 5,399,891 which is a continuation of U.S. application No. 07/823,892, filed 22 Jan. 1992, now U.S. Pat. No. 5,341,468 invented by Yiu, et al.

RELATED APPLICATION DATA

The present application is related to co-pending application entitled FLASH EPROM INTEGRATED CIRCUIT ARCHITECTURE, filed on the same day as the present application, invented by Yiu, et al., and owned by the same Assignee as the present application now and at the time of invention.

BACKGROUND OF THE INVENTION

1. Field of the Invention

The present invention relates to flash EPROM memory technology, and more particularly to unique cell structure having extended floating gates to improve the coupling ratio between the control gate, floating gate, and source or drain of the transistor cell.

2. Description of Related Art

Flash EPROMs are a growing class of non-volatile storage integrated circuits. These flash EPROMs have the capability of electrically erasing, programming, and reading a memory cell in the chip. The memory cell in a flash EPROM is formed using so-called floating gate transistors, in which the data is stored in a cell by charging or discharging the floating gate. The floating gate is a conductive material, typically made of polysilicon, which is insulated from the channel of the transistor by a thin layer of oxide, or other insulating material, and insulated from the control gate or word line of the transistor by a second layer of insulating material.

Data is stored in the memory cell by charging or discharging the floating gate. The floating gate is charged through a Fowler-Nordheim tunneling mechanism by establishing a large, positive voltage between the control gate and source or drain. Alternatively, an avalanche mechanism may be used by applying potentials to induce high energy electrons in the channel of the cell which are injected across the insulator to the floating gate. The voltage on the control gate is divided by the so-called coupling ratio of the cell, resulting in a first voltage between the control gate and floating gate, and a second voltage between the floating gate and the source or drain. With a 50% coupling ratio, half of the voltage applied to the control gate appears across the oxide between the floating gate and the source or drain. This voltage between the floating gate and the source or drain causes electrons to tunnel or be injected into the floating gate through the thin insulator. When the floating gate is charged, the threshold voltage for causing the memory cell to conduct is increased above the voltage applied to the word line during a read operation. Thus, when a charged cell is addressed during a read operation, the cell does not conduct. The non-conducting state of the cell can be interpreted as a binary 1 or a zero, depending on the polarity of the sensing circuit.

The floating gate is discharged to establish the opposite memory state. This function is typically carried out by F-N tunneling between the floating gate and the source or drain of the transistor, or between the floating gate and the substrate. For instance, the floating gate may be discharged through the source by establishing a large, positive voltage from the source to the gate, while the drain is left at a floating potential.

The high voltages used to charge and discharge a floating gate place significant design restrictions on flash memory devices, particularly as the cell dimensions and process specifications are reduced in size. Thus, the coupling ratio for the memory cells becomes a critical design parameter.

One way of increasing the coupling ratio, is to increase the surface area of the floating gate between the control gate and the floating gate. This can be accomplished by extending the floating gate over the source or drain regions, such as described in Bergemont, et al., U.S. Pat. No. 5,012,446.

One approach to extending the floating gate is described in Kume, et al., "A 1.28 $\mu m^2$ Contactless Memory Cell Technology for a 3 V-only 64 Mbit EEPROM", IEDM 92, pp. 991–993; Hisamune, et al., "A High Capacitive-Coupling Ratio (HiCR) Cell for 3 V-only 64 Mbit and Future Flash Memories", IEDM 93, pp. 19–22.

All of these prior art designs for extending the floating are relatively complicated process technologies.

Accordingly, an improved process for extending the floating gate to increase the coupling ratio of flash EPROM, and a circuit for utilizing such structure, is desirable.

SUMMARY OF THE INVENTION

The present invention provides novel contactless, flash EPROM cell and array designs, and methods for fabricating the same, which result in dense, segmentable flash EPROM chip. The flash EPROM cell is based on a unique drain-source-drain configuration, in which a single source diffusion is shared by two columns of transistors. Also, a new memory circuit architecture suited for the flash EPROM cells of the present invention is possible.

According to one aspect of the present invention, a flash EPROM transistor array is provided which is manufactured in a substrate having a first conductivity type. A drain diffusion region of a second conductivity type is formed in the substrate and elongated in a first direction having a drain width transverse to the first direction. A source diffusion region of a second conductivity type is placed in the substrate, elongated in the first direction, and spaced away from the drain diffusion region to provide a channel region between the source and drain diffusion regions. An insulating layer is placed over the channel region and over the source and drain diffusion regions. A plurality of floating gate electrodes are formed overlying the first insulating layer over the channel region. A second insulating layer is placed over the floating gate electrodes, and a plurality of control gate electrodes are formed over the second insulating layer, elongated in a second direction which intersects the source and drain diffusion regions over the respective floating gate electrodes. This establishes a plurality of flash EPROM transistors in a column across the channel region.

According to the present invention, the floating gate electrodes comprise a first conductive layer deposited in a first deposition process having a first major surface adjacent the first insulating layer with a channel surface area over the channel region. A second major surface of the floating gate electrode opposite the first major surface has a surface area substantially equal to the channel surface area. The sides of the floating gate electrode between the first and second major surfaces are used to define the channel length during a diffusion process which forms the source and drain diffusion regions. A conductive spacer is deposited after the diffusion process, contacting the first conductive layer on at least one of the sides to provide in combination with the first conductive layer a floating gate electrode having a control surface area under the control electrode substantially greater than the channel surface area.

The conductive spacer is preferably placed on both sides of the floating gate electrode to extend the floating gate out over both the source and drain diffusion regions. These conductive spacers may be substantially symmetrical, which provides for easy scaling of the process to smaller and smaller dimensions.

Further, a process for implementing a flash array in the drain-source-drain configuration includes the floating gate electrodes consist of a first polysilicon layer over the channel region, a second polysilicon layer contacting the first polysilicon layer. In one aspect of the invention, the floating gate for a cell on one side is elongated in a direction out over the first drain diffusion region in an amount substantially greater than one-half the drain width. The cell on the opposite side of the drain-source-drain configuration, has a floating gate which extends over the second drain diffusion region in the opposite direction in a symmetrical manner. This allows a designer to take advantage of the space consumed by isolation regions to improve the coupling ratio.

The present invention can also be characterized as a unique method for fabricating flash EPROM transistors on a substrate which includes the following steps:

A method for fabricating a plurality of flash EPROM transistors on a substrate, comprising:

forming a floating gate insulating layer over at least a portion of the substrate;

defining a plurality of strips of polysilicon in a first polysilicon deposition over the floating gate insulating layer;

exposing the substrate to dopants so that the plurality of strips act as a mask and a plurality of doped regions in the substrate are formed between the plurality of strips of conductive material;

annealing the substrate to drive in the dopants in the doped regions to establish buried diffusion regions aligned with the strips of polysilicon;

forming a thicker insulator with an insulating material over the buried diffusion regions exposing the plurality of strips of polysilicon;

depositing a second polysilicon deposition over and in contact with the plurality of strips;

etching the second polysilicon deposition for a predetermined time to form self-aligned conductive spacer lines overlying the thicker insulator over the buried diffusion regions, each conductive spacer line contacting only one of the plurality of strips;

forming a control gate insulator over the plurality of strips and the conductive spacer lines;

depositing a third polysilicon deposition over the control gate insulator; and etching the third deposition to define control gate conductors, and the conductive spacers and the plurality of conductive strips to define floating gates.

Thus, a unique flash EPROM cell structure and process for manufacturing the same is provided capable of achieving high packing densities. The structure has a high coupling ratio, so that lower voltages may be utilized in programming and erasing the cells. Also, the design allows for a number of other advantages which can be seen upon review of the figures, the detailed description and the claims which follow.

BRIEF DESCRIPTION OF THE FIGURES

FIG. 4A is a flow chart of a page program operation according to the present invention.

FIG. 4B is a simplified schematic showing program verify circuitry according to the present invention.

FIGS. 5A–5H illustrate the steps in manufacturing a first type of flash EPROM cell according to the present invention, with an extended floating gate for improved coupling ratio.

FIGS. 6A–6G illustrate the final six steps in a sequence which begins as set out in FIGS. 5A–5D, for implementing an alternative embodiment of the flash EPROM cells according to the present invention.

FIG. 7 provides a perspective of the layout of a flash EPROM segment according to the present invention.

FIGS. 8–14 are mask layouts for implementing the flash EPROM segment of FIG. 7, in which:

FIG. 8 illustrates the layout of a first diffusion and a field oxide isolation in the substrate.

FIG. 9 illustrates the region of a p+ type cell implant for raising the threshold voltage in the cells of the array.

FIG. 10 illustrates the layout of a first polysilicon layer.

FIG. 11 illustrates the layout of a second polysilicon layer.

FIG. 12 illustrates the layout of a third polysilicon layer.

FIG. 13 illustrates the positioning of metal contacts.

FIG. 14 illustrates the layout of the overlying metal lines for the subarray.

DETAILED DESCRIPTION

Figure 1:
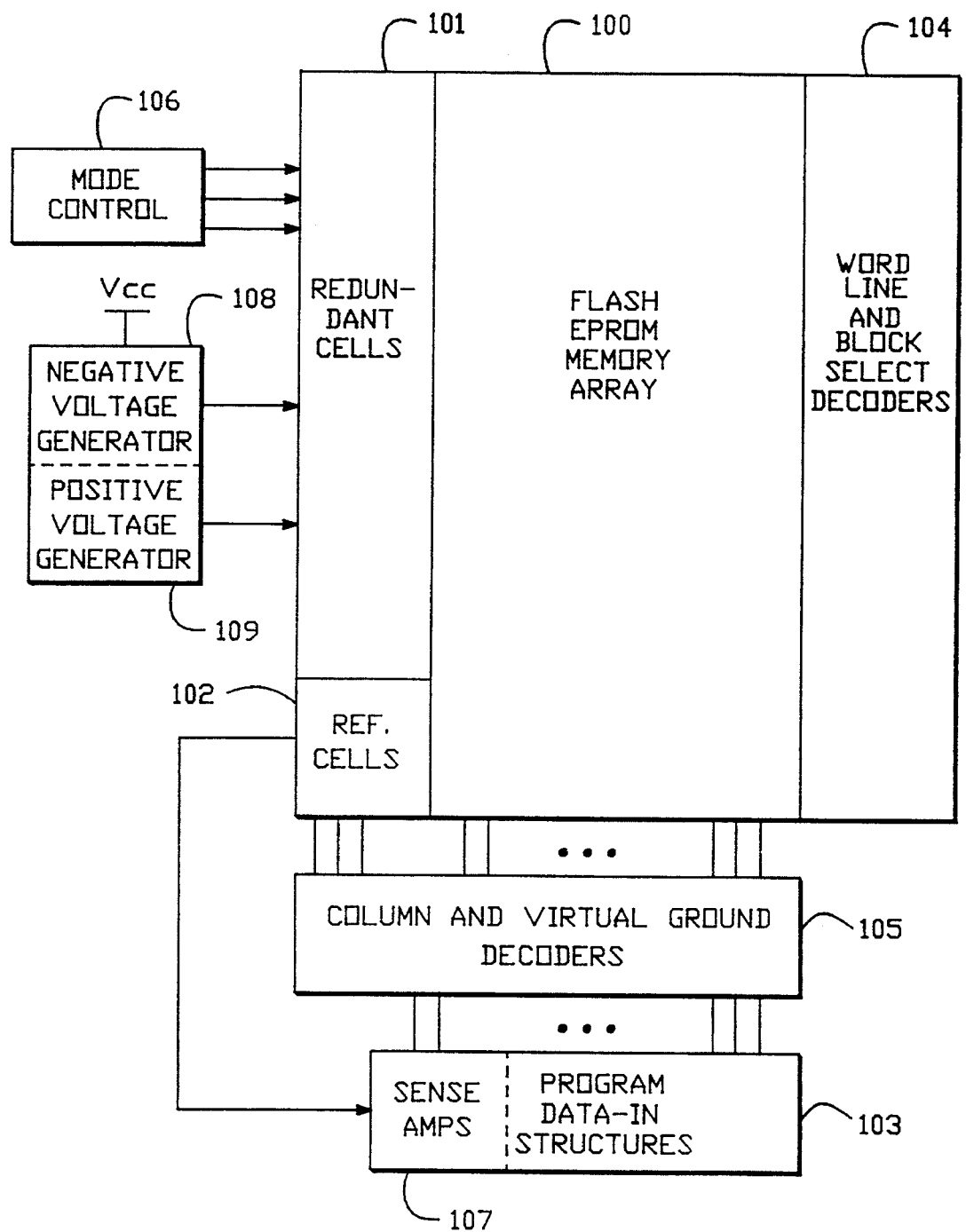
FIG. 1 is a schematic diagram of a flash EPROM integrated circuit module according to the present invention.

A detailed description of preferred embodiments of the present invention is provided with respect to the figures, in which FIG. 1 provides an overview of the layout of a flash EPROM integrated circuit module according to the present invention. Thus, the integrated circuit module of FIG. 1 includes a flash EPROM memory array 100 coupled to a plurality of redundant memory cells 101 used for replacing failed cells in the main array as known in the art. A plurality of reference cells 102 are used with sense amps 107 for differential sensing the state of the cells in the memory array.

Coupled to the memory array 100 are word line and block select decoders 104 for horizontal decoding in the memory array. Also coupled to the memory array 100 are the column decoder and virtual ground circuit 105 for vertical decoding in the array.

Coupled to the column decoder and virtual ground circuit 105 are the program data in structures 103. Thus, the sense amps 107 and the program data in structures 103 provide data in and out circuitry coupled to the memory array.

The flash EPROM integrated circuit typically is operated in a read only mode, a program mode, and an erase mode. Thus, mode control circuitry 106 is coupled to the array 100.

Finally, according to one embodiment of the present invention, during the program and erase modes, a negative potential is applied to either the gate or source and drain of the memory cells. Thus, a negative voltage generator 108 and a positive voltage generator 109 are used for supplying various reference voltages to the array. The negative voltage generator 108 and positive voltage generator 109 are driven by the power supply voltage $V_{CC}$.

Figure 2:
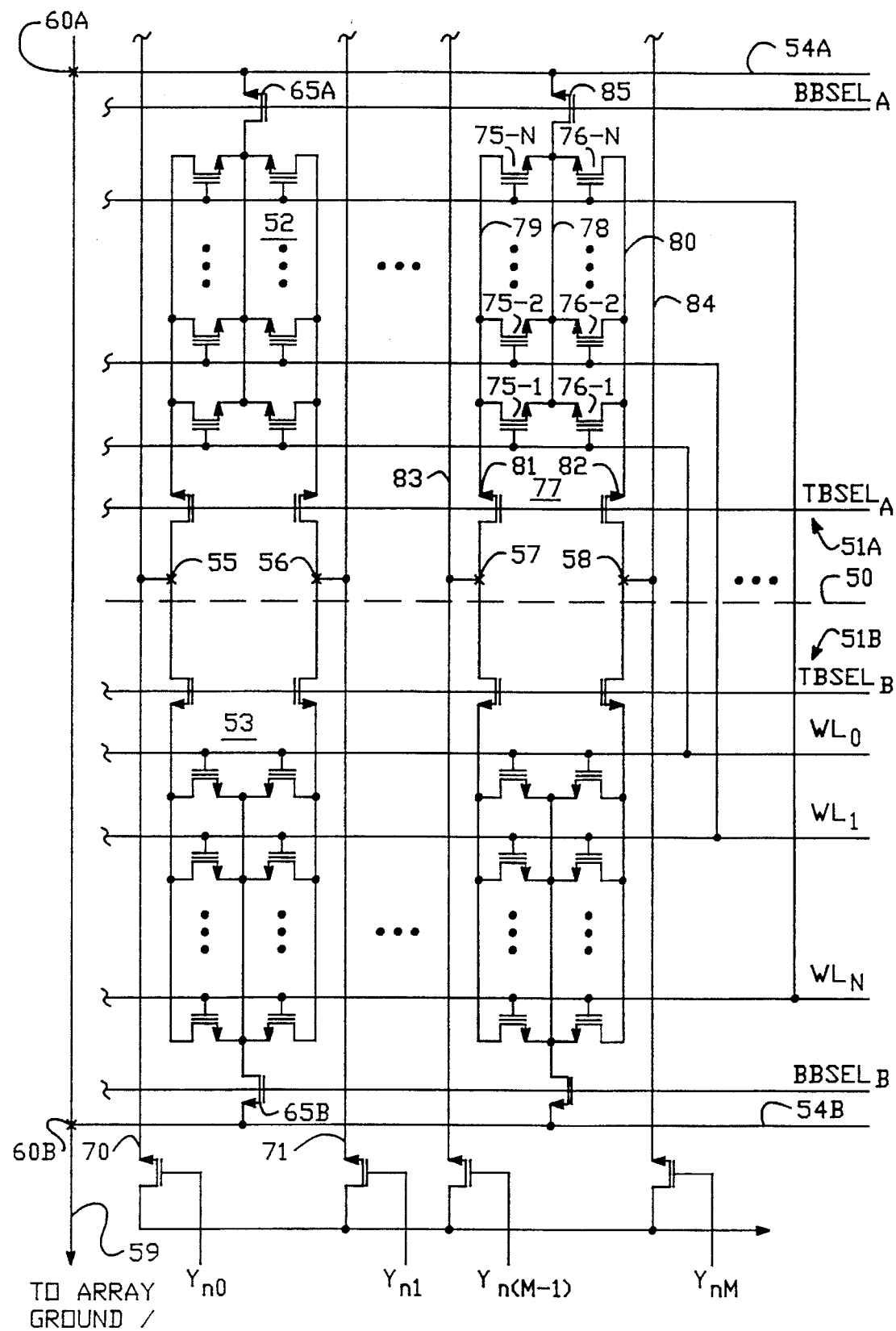
FIG. 2 is a schematic diagram of a drain-source-drain configured, virtual ground, flash EPROM array according to one embodiment of the present invention.

FIG. 2 illustrates two segments within a larger integrated circuit. The segments are divided generally along dotted line 50 and include segment 51A generally above the dotted line 50 and segment 51B generally below the dotted line 50. A first pair 52 of columns in segment 51A is laid out in a mirror image with a second pair 53 of columns in segment 51B along a given global bit line pair (e.g., bit lines 70, 71). As one proceeds up the bit line pair, the memory segments are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 59 through metal-to-diffusion contacts 60A, 60B. The segments repeat on opposite sides of the metal virtual ground line 59 so that adjacent segments share a metal virtual ground line 59. Thus, the segment layout of FIG. 2 requires two metal contact pitches per column of two transistor cells for the global bit lines and one metal contact pitch per segment for the metal virtual ground line 59.

Each of the pairs of columns (e.g., 52, 53) along a given bit line pair comprises a set of EPROM cells. Thus, cells 75-1, 75-2, 75-N comprise a first set of flash EPROM cells in a first one of the pair 77 of columns. Cells 76-1, 76-2, 76-N comprise a second set of flash EPROM cells in the second column in the pair 77 of columns.

The first set of cells and the second set of cells share a common buried diffusion source line 78. The cells 75-1, 75-2, 75-N are coupled to buried diffusion drain line 79. Cells 76-1, 76-2, 76-N are coupled to buried diffusion drain line 80. Selector circuitry comprising top select transistor 81 and top select transistor 82 couple the respective drain diffusion lines 79, 80 to metal global bit lines 83 and 84, respectively. Thus, the transistor 81 has a source coupled to the drain diffusion line 79 and a drain coupled to a metal contact 57. Transistor 82 has a source coupled to the drain diffusion line 80 and a drain coupled to the metal contact 58. The gates of transistors 81 and 82 are controlled by the signal $TBSEL_A$ to couple the respective columns of flash EPROM cells to the global bit lines 83 and 84.

The source diffusion line 78 is coupled to the drain of select transistor 85. The source of select transistor 85 is coupled to a virtual ground diffusion line 54A. The gate of transistor 85A is controlled by the signal $BBSEL_A$.

Furthermore, a sector of two or more segments as illustrated in FIG. 2 may share word line signals because of the additional decoding provided by the top and bottom block select signals $TBSEL_A$, $TBSEL_B$, $BBSEL_A$, and $BBSEL_B$. In one embodiment, eight segments share word line drivers, providing a sector eight segments deep.

As can be seen, the architecture according to the present invention provides a sectored flash EPROM array. This is beneficial because the source and drain of transistors in non-selected segments during a read, program or erase cycle may be isolated from the currents and voltages on the bit lines and virtual ground lines. Thus, during a read operation, sensing is improved because leakage current from segments not selected does not contribute to current on the bit lines. During the program and erase operations, the voltages of the virtual ground line, and the bit lines, are isolated from the unselected segments. This allows a sectored erase operation, either segment by segment or preferably sector by sector when the segments within a given sector share word line drivers.

Figure 3:
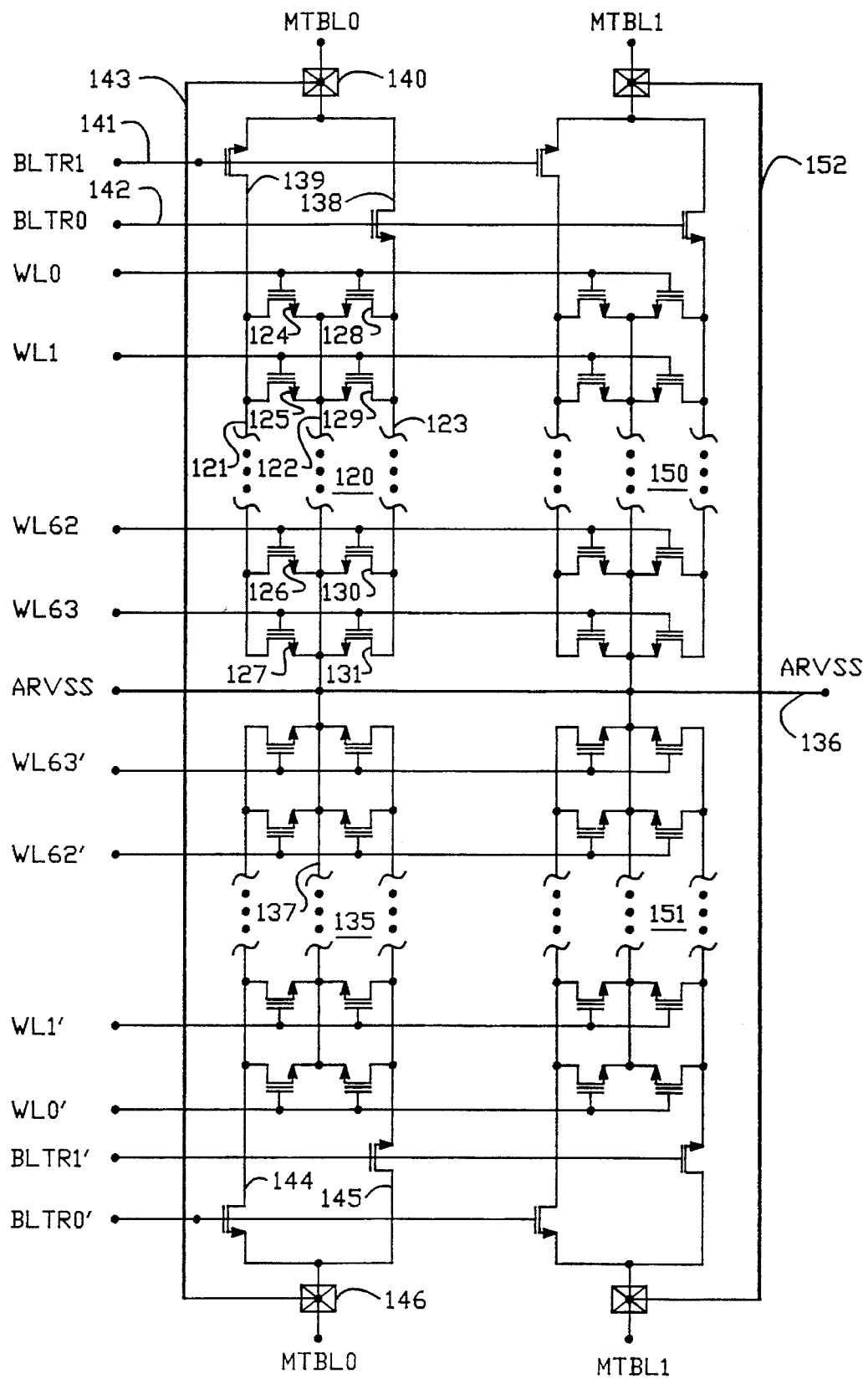
FIG. 3 is a schematic diagram of an alternative embodiment of the present invention with two columns of flash EPROM cells sharing a single metal bit line.

It will be appreciated that the bottom block select transistors (e.g., transistors 65A, 65B) may not be necessary in a given implementation as shown in FIG. 3 below. Also, these block select transistors may share a bottom block select signal with an adjacent segment. Alternatively, the bottom block select transistors (e.g., 65A, 65B) may be replaced by single isolation transistors adjacent the virtual ground terminals 60A, 60B.

FIG. 3 illustrates an alternative architecture of the flash EPROM array according to the present invention, in which two columns of flash EPROM cells share a single metal bit line. FIG. 3 shows four pairs of columns of the array, where each pair of columns includes flash EPROM cells in a drain-source-drain configuration.

Thus, the first pair 120 of columns includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. As shown in the figure, a first pair 120 of columns includes one column including cell 124, cell 125, cell 126, and cell 127. Not shown are cells coupled to word lines WL2 through WL61. The second one of the pair 120 of columns includes cell 128, cell 129, cell 130, and cell 131. Along the same column of the array, a second pair 135 of columns is shown. It has a similar architecture to the pair 120 of columns except that it is laid out in a mirror image.

Thus, as can be seen, the transistor in the first one of the pair of columns, such as the cell 125, includes a drain in drain diffusion line 121, and a source in the source diffusion line 122. A floating gate overlays the channel region between the first drain diffusion line 121 and the source diffusion line 122. The word line WL1 overlays the floating gate of the cell 125 to establish a flash EPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a source in the drain diffusion line 121, a drain coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cell with additional select circuitry.

The architecture shown in FIG. 2 and 3 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells.

Column pairs are laid out horizontally and vertically to provide an array of flash EPROM cells comprising M word lines and 2N columns. The array requires only N metal bit lines each of which is coupled to a pair of columns of flash EPROM cells through select circuitry, as described above.

Although the figure only shows four column pairs 120, 135, 150, and 151, coupled to two metal bit lines 143 and 152 (MTBL0–MTBL1), the array may be repeated horizontally and vertically as required to establish a large scale flash EPROM memory array. Thus, column pairs 120 and 150 which share a word line are repeated horizontally to provide a segment of the array. Segments are repeated vertically. A group of segments (e.g., eight segments) having respective word lines coupled to a shared word line driver may be considered a sector of the array.

The layout of the array is compact because of the virtual ground configuration, the reduced metal pitch requirement for the layout, and further by the ability to share word line drivers amongst a plurality of rows in different segments. Thus, word line WL63' may share a word line driver with word line WL63. In a preferred system, eight word lines share a single word line driver. Thus, only the pitch of one word line driver circuitry is needed for each set of eight rows of cells. The additional decoding provided by the left and right select transistors (139, 138 for segment 120) allows the shared word line configuration. The shared word line configuration has the disadvantage that during a sector erase operation, eight rows of cells all receive the same word line voltage, causing a word line disturbance in cells that are not desired to be erased. If it is a problem for a given array, this disturbance problem can be eliminated by insuring that all sector erase operations decode for segments including all rows of cells coupled to the shared word line drivers. For eight word lines sharing a single driver, a minimum sector erase of eight segments may be desired.

Figure 4:
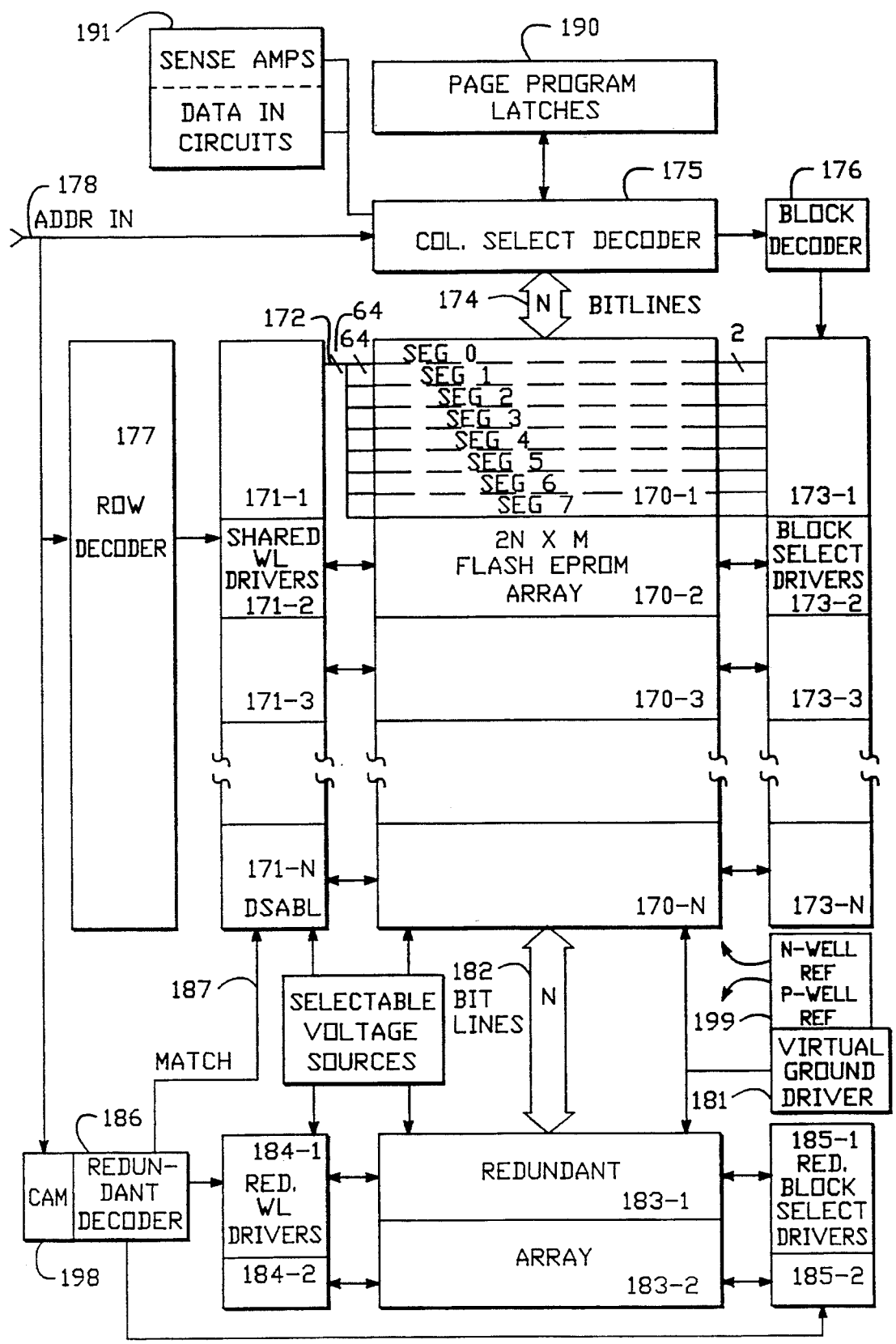
FIG. 4 is a schematic block diagram of a segmentable flash EPROM array with redundant rows for correction of failed rows in the main array.

FIG. 4 is a schematic block diagram of a flash EPROM array meant to illustrate certain features of the present invention. Thus, the flash EPROM memory module shown in FIG. 4 includes a main flash EPROM array, including sectors 170-1, 170-2, 170-3, 170-N, each sector including eight segments (e.g., SEG0–SEG7). A plurality of sets of shared word line drivers 171-1, 171-2, 171-3, 171-N are used to drive the shared word lines of the eight segments in the respective sectors. As illustrated with respect to shared word line drivers 171-1, there are 64 shared drivers for sector 170-1. Each of the 64 drivers supplies an output on line 172. Each of these outputs is used to drive eight word lines in respective segments of the sector 170-1 as schematically illustrated in the figure by the division into eight sets of 64 lines.

Also coupled to the array are a plurality of block select drivers 173-1, 173-2, 173-3, 173-N. The block select drivers each drive a left and right block select signal for each segment. Where the segments are implemented as shown in FIG. 3, there is a BLTR1 and BLTR0 block select signal pair supplied for each set of 64 word lines.

In addition, there are N global bit lines in the flash EPROM array. The N bit lines are used to allow access to the 2N columns of flash EPROM cells in the array for the data in circuitry and sense amps 191. The N bit lines 174 are coupled to a column select decoder 175. Similarly, the block select drivers 173-1 through 173-N are coupled to a block decoder 176. The shared word line drivers 171-1 through 171-N are coupled to row decoder 177. The column select decoder 175, block decoder 176, and row decoder 177 receive address signals on the address in line 178.

Coupled to the column select decoder 175 is page program buffer 190. The page program buffer 190 include N latches, one for each of the N bit lines. Thus, a page of data may be considered N bits wide, with each row of cells two pages, page 0 and page 1, wide. Pages in a given row are selected using the left and right decoding described above.

Selectable voltage sources 179 are used to supply the reference potentials for the read only, program, and erase modes for the flash EPROM array as conceptually illustrated in the figure, through the word line drivers 171-1 to 171-N and through the bit lines.

The virtual ground lines in the array are coupled to the virtual ground driver 181 which is coupled with the array. Also, p-well and n-well reference voltage sources 199 are coupled to the respective wells of the array.

Thus, as can be seen in FIG. 4, the 64 word line drivers, such as word line drivers 171-1, are used with 512 (64×8) rows in the array. The additional decoding provided by the block select drivers (e.g., 173-1) allow for the shared word line layout.

The architecture of the flash EPROM array, according to the present invention, allows for row redundancy as schematically illustrated in FIG. 4. Thus, the W bit lines extend from the main array across lines 182 to a redundant array including sectors 183-1 and 183-2. The redundant array is driven by the redundant word line drivers 184-1 and 184-2. Similarly, redundant block select drivers 185-1 and 185-2 are coupled to the redundant array.

If, during testing, a cell on a given row is found defective, that row and the seven other rows which share the word line driver may be replaced by corresponding rows in the redundant array 183-1 and 183-2. Thus, the system would include a content addressable memory (CAM) cell 198 with a redundant decoder 186 which receives the address data. As known in the art, during testing, failed rows in the main array are identified, and the address of such rows is stored in the CAM cell 198. When the address ADDR IN on line 178 matches the address stored in the CAM cell 198, then a match signal is generated on line 187. The match signal disables the shared word line drivers 171-1 through 171-N in the main array. The redundant decoder 186 drives the redundant word line drivers 184-1 and 184-2, and drives redundant block select drivers 185-1 and 185-2 to select the appropriate replacement row.

The redundant row decoding may also be coupled with redundant column decoding, as known in the art, to provide a flash EPROM array with much greater manufacturing yield.

The column select decoder 175 is coupled to the page program latches 190, including at least one latch for each of the N bit lines. Also, the column select decoder 175 is coupled to the data in circuitry and sense amps 191. Together, these circuits provide data in and out circuitry for use with the flash EPROM array.

Redundant row decoding also provides capability of correcting for shorts between adjacent word lines. In particular, when two word lines are shorted, two word lines must be replaced with corresponding two word lines in the redundant array. In the embodiment described, where there are eight word lines sharing a common word line driver, two sets of eight word lines are used to replace a corresponding two sets of eight word lines in the main array. Thus, the two shorted word lines in the main array can be repaired with row redundancy.

The cells in the preferred embodiment are configured for a sector erase operation that causes charging of the floating gate (electrons entering the floating gate) such that upon sensing an erased cell, the cell is non-conducting and the output of the sense amp is high. Also, the architecture is configured for a page program which involves discharging a floating gate (electrons leaving the floating gate) such that upon sensing, a programmed cell is conducting.

The operation voltages for the programming operation are positive 5 volts to the drain of a cell to be programmed to a low (data=0) threshold condition, negative 10 volts to the gate, and 0 volts or floating of the source terminal. The substrate or the p-well 200 shown in FIGS. 5G and 6H is grounded. This results in a Fowler-Nordheim tunneling mechanism for discharging the floating gate.

The erase operation is executed by applying negative 6 volts to the drain, positive 12 volts to the gate, and negative 6 volts to the source. The p-well 200 is biased at negative 6 volts. This results in a Fowler-Nordheim tunneling mechanism to charge the floating gate. The read potentials are 1.2 volts on the drain, 5 volts on the gate, and 0 volts on the source.

This sets up the ability to do a sector erase using word line decoding to select cells to be erased. The erase disturbance condition for unselected cells within a segment results in −6 volts on the drain, 0 volts on the gate, and −6 volts on the source. This is well within the tolerances of the cells to withstand these potentials without causing significant disturbance of the charge in the cell.

Similarly, the program disturbance conditions, for cells which share the same bit line in the same segment are 5 volts on the drain, 0 volts on the gate, and 0 volts or floating on the source. There is no gate to drain drive in this condition and it does not disturb the cell significantly.

For cells which share the same word line but not the same bit line or an addressed cell which is to remain in a high condition, the disturbance condition is 0 volts on the drain, −10 volts on the gate, and 0 volts or floating on the source. Again, this condition does not result in significant deterioration of the charge in the unselected cells.

The two well technology is critical so that the negative voltage can be applied to the drain and source diffusion regions. Without the negative voltages on the source and drain, the gate potential for a cell with a 50% coupling ratio, requiring about 9 volts across the floating gate/drain junction, must be about 18 volts. These very high voltages on integrated circuits require specially designed circuits and special process technology. Similarly, the negative voltage on the gate allows lower positive potentials on the drain for the program operation.

FIG. 4A is a flow chart illustrating the program flow for the flash EPROM circuit of FIG. 4. The process begins by erasing the sector (e.g., sector 70-1) into which data is to be programmed (block 600). After erasing the sector, an erase verify operation is executed (block 601). Next, the page number, either 0 or 1, and the segment number, 1–8, is set by the host processor in response to the input address (block 602).

After setting the page number and segment number, the page buffer is loaded with the data for the page (block 603). This page buffer may be loaded with an entire N bits of data, or a single byte of data, as suits a particular program operation. Next, a verify operation is executed, in case the user does not pre-erase, to determine which cells need programming (block 604). After loading the page buffer, the program potentials are applied to the segment being programmed (block 605). After the program operation, a verify operation is executed in which the page is verified. In the verify operation, the bits in the page buffer which correspond to successfully programmed cells are turned off (block 606). Next, the algorithm determines whether all page bits are turned off in the page buffer (block 607). If they are not all off, then the algorithm determines whether a maximum number of retries has been made (block 610), and if not, loops to block 605 to program the page again, such that the failed bits are reprogrammed. The bits which pass are not reprogrammed because the corresponding bits in the page buffer were reset to 0 during the verify operation. If the maximum number of retries has been made at block 610, then the algorithm hangs up, signaling an unsuccessful operation.

If at block 607, all page bits were off, then the algorithm determines whether the sector has been finished, that is, whether both pages of the sector are to be written and both are completed (block 608). This is a CPU determined parameter. If the sector is not finished, then the algorithm loops to block 602 and updates the appropriate one of the page number or segment number.

If the sector has been finished at block 608, then the algorithm is done (block 609).

As mentioned with respect to block 605 of FIG. 4A, the program verify circuitry involves resetting on a bit by bit basis, the data in the page buffer which passes erase verify. Thus, a structure such as shown in simplified form in FIG. 4B is included in the flash EPROM. The sense amps 650 of the array are coupled to a compare circuitry 651. The inputs to the compare circuitry are the page buffer latches 652. Thus, a byte of data from the sense amps is compared against a corresponding byte from the page buffer. A pass/fail signals for the byte are fed back to a bit reset on the page buffer 652. Thus, bits which pass are reset in the page buffer. When all bits in the page buffer are reset, or a set number of retries of the program operation has been accomplished, then the program operation is complete.

Figure 5H:
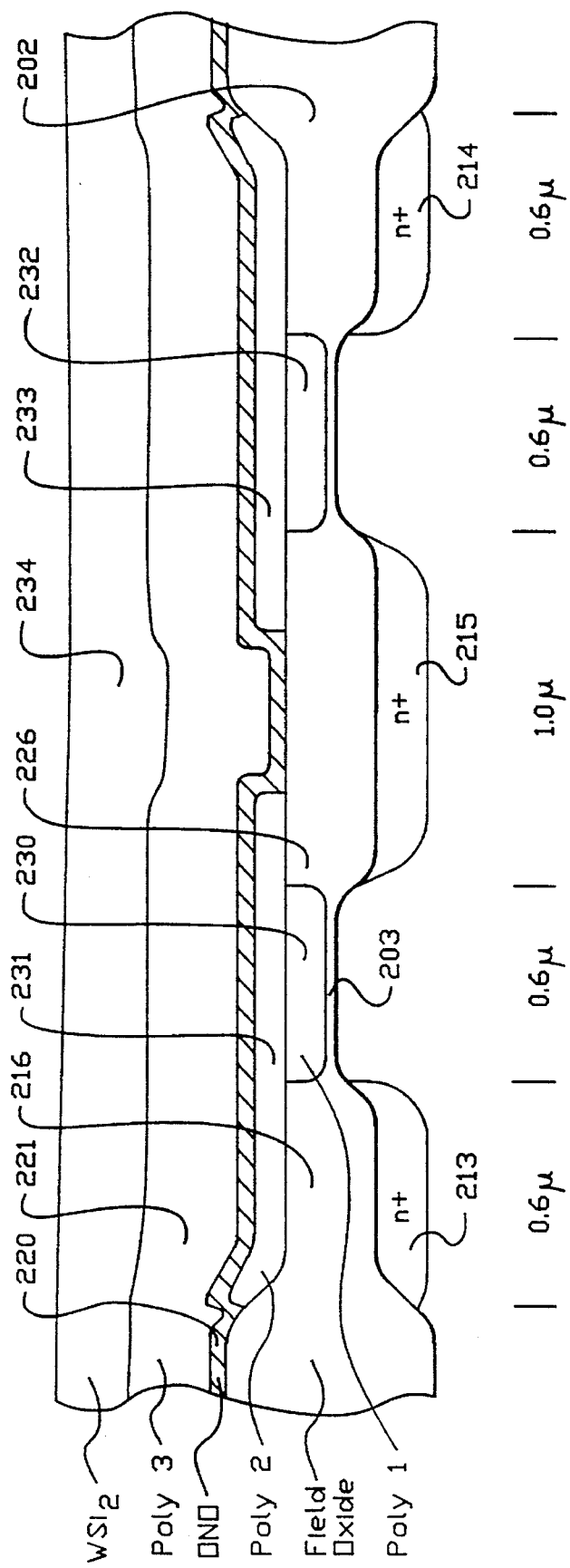
Figure 6G:
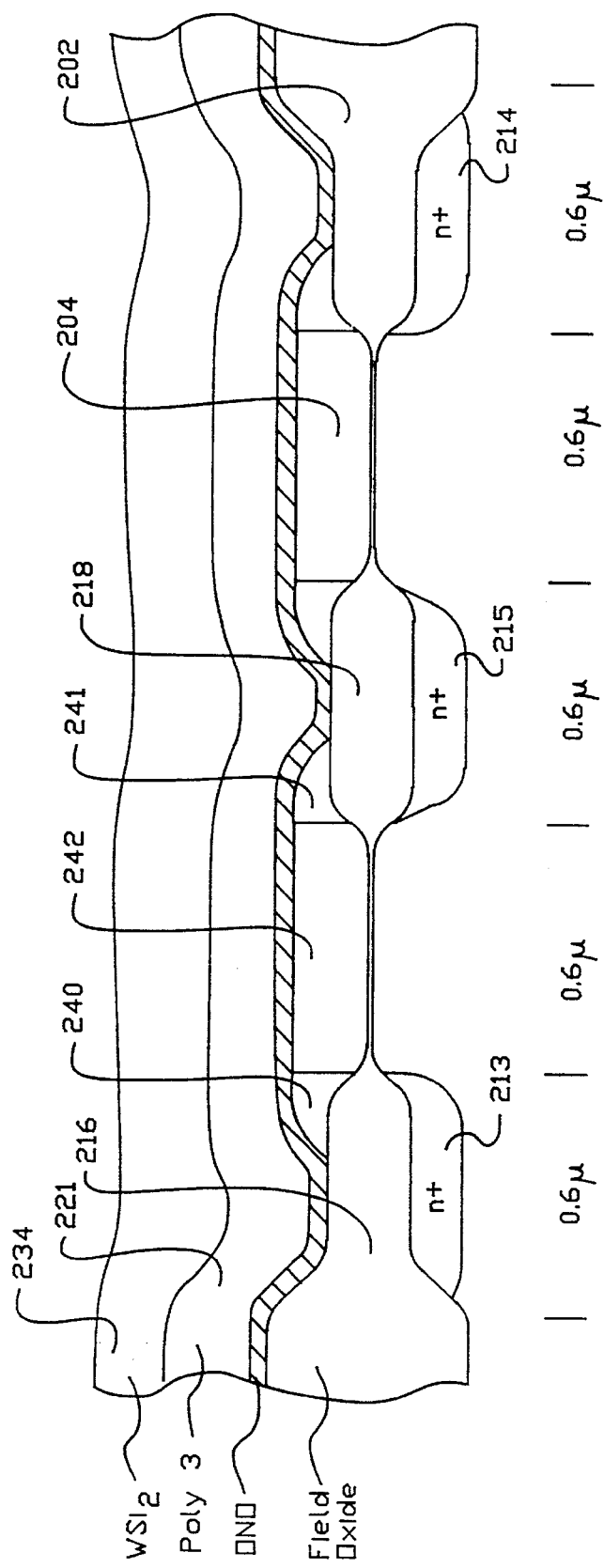

FIGS. 5A–5H illustrate manufacturing steps for a flash EPROM array according to one embodiment of the present invention. FIGS. 5A–5G are not drawn to scale. FIG. 5H is an approximate scale drawing to provide perspective for the resulting structure. FIGS. 6A–6G provide an alternative approach to manufacturing the flash EPROM cell, which involves the same initial steps, as illustrated in FIGS. 5A–5D. As with FIG. 5H, FIG. 6G is an approximate scale drawing of the resulting structure. FIGS. 7 and 8–14 are used to describe the layout of a three word line by six column test array for the embodiment described with respect to FIGS. 5A–5H, and FIG. 3.

The process of FIGS. 5A–5H will be described first. The cell is fabricated using a 0.6 micron CMOS double metal, triple well (two wells in the array, a third for peripheral circuitry), and triple poly technology. The primary steps involved in manufacturing the cell are shown in FIGS. 5A–5H.

FIG. 5A illustrates the first step in the process. Starting with a p-type silicon substrate 200 (or region of the substrate), a deep n-type well 198, around 6 microns in depth is formed. Next, a p-well 199, around 3 microns in depth, is formed inside the n-well.

The deep n-well 198 is formed first by implanting an n-type dopant into the substrate where the n-well region is defined by a photoresist mask. After implant, the photo mask is removed and the substrate is annealed at high temperature for a relatively long time to drive in and activate the n-type dopant to form the deep well. Then, a similar process is formed to implement a p-well inside the deep n-well.

In the next step, a well known LOCOS field oxidation process is used to grow relatively thick field oxide regions 201 and 202 which are elongated in a direction perpendicular to the page. Also, a sacrificial oxide layer is grown and then removed to prepare the surface of the p-well 199 for subsequent steps.

As illustrated in FIG. 5B, a thin tunnel oxide 203 is grown about 90 Å thick. As illustrated in FIG. 5C, a first layer poly 204 is deposited of about 800 Å on top of the tunnel oxide 203. Then, a thin nitride layer 205 of about 200 Å is deposited on top of the poly layer 204.

As illustrated in FIG. 5D, a photomasking process is used to define the floating gates, and n+ source and drain diffusion regions. Thus, photomask layers 206, 207 are defined to protect the floating gate regions in poly one 204. The poly one 204 and nitride layers 205 are etched away except as protected by the masks 206 and 207 to expose the drain, source and drain regions. Next, n-type dopants are implanted in the p-well 199 as illustrated at arrows 208 within the exposed regions. These regions are therefore self-aligned to the floating gate in poly one 204 and to the field isolation regions 201 and 202.

As illustrated in FIG. 5E, the substrate is annealed to activate the dopants and define the drain diffusion regions 213 and 214, and the source diffusion region 215. Also, drain oxides 216, 217 and source oxide 218 of about 2,000 Å are grown, along with oxides 225 and 226 covering the sides of the floating gate poly 204.

In the next step, the nitride layer 205 on the floating gates is removed and then a second layer 219 of poly (poly two) is deposited over the first layer. The second layer 219 is about 800 Å thick and deposited on top of poly one. This layer is implanted with an n-type dopant.

As shown in FIG. 5F, a photomasking process is used to define the poly two pattern, which in turn defines the effective floating gate area as seen from the control gate to be deposited in poly three. The effective floating gate area is increased by the poly two deposition so that the coupling ratio is high enough and preferably about or larger than 50%. During following high temperature annealing steps, the n-type dopants will uniformly distribute between poly two and poly one layers, resulting in very low resistance contact between the two layers.

As illustrated in FIG. 5G, an ONO layer 220 is grown on top of the poly two layer. The ONO layer is about 180 Å thick. Finally, a third poly layer 221 (poly three) is deposited on top of the ONO and, after deposition of tungsten silicide as shown in FIG. 5H, etched to define the word line for the memory cells.

FIG. 5H illustrates the layer of tungsten silicide 234 over the poly three layer 221 used to improve the conductivity of the word lines. FIG. 5H is an approximate scale sketch of the structure of the resulting cell. According to the process of FIGS. 5A–5H, the drain diffusion region 213 is formed in a region between the field oxide 202 and the poly one layer of the floating gate 230, which is about 0.6 microns wide. Similarly, the poly one portion of the floating gate 230 is about 0.6 microns wide. The source diffusion region between floating gate regions 230 and 232 is approximately 1.0 microns wide. The drain diffusion region 214 is approximately 0.6 microns wide.

The 1.0 micron wide source diffusion region 215 is formed slightly wider to allow for alignment tolerances for the poly two deposition process. With a more controlled alignment process, the width of the source diffusion region 215 can be reduced.

The vertical dimensions of the various elements are shown in approximate scale in FIG. 5H. Thus, the tunnel oxide 203 under the poly one portion of the floating gate electrode 230 or 232 is approximately 90 angstroms thick. The poly one deposition 230 is approximately 800 angstroms thick. The oxide region 216 over the drain diffusion region 213, and similarly the oxides over the source diffusion region 215 and drain diffusion region 214 as grown are approximately 2,000 to 2,500 angstroms thick, but as finished are in the range of 1,000 to 1,500 angstroms.

The side wall oxide 226 on the poly one portion of floating gate 230 is in the range of 600 angstroms thick. As can be seen in the sketch, it merges with the thermal oxide 216 over the source or drain diffusion region as appropriate.

The thickness of the second poly deposition 231 is approximately 800 angstroms. The thickness of the ONO layer 220 is approximately 180 angstroms. The third poly layer 221 is approximately 2,500 angstroms thick. The tungsten silicide layer 234 is approximately 2,000 angstroms thick. The field oxide region 202 in the finished product is in the range of 6,500 to 5,000 angstroms thick.

FIG. 5H illustrates a feature of the process of FIGS. 5A–5H. As can be seen, in FIG. 5G, the second poly deposition 233 only partially covers the drain diffusion region 214. In FIG. 5H, an alternative mask is used to extend the poly two portion of the floating gate across the drain diffusion region partially overlapping the field oxide region 202. This variability in the process allows the coupling ratio of the floating gate to be varied as suits the needs of a particular design by extending its length out over the field oxide region.

Metallization and passivation layers (not shown) are deposited over the circuit of FIG. 5H.

Thus, as can be seen in FIG. 5H, a floating gate structure for a drain-source-drain configured flash EPROM segment is provided which consists of a first layer polysilicon 230 and a second layer polysilicon 231. The first layer poly 230 is used for self-alignment of the source and drain diffusion regions. The second layer poly 231 is used to extend the floating gate surface area to increase the coupling ratio of the cell.

In the drain-source-drain configuration, it can be seen that the floating gate consisting of poly one layer 230 and poly two layer 231 for the cell on the left side, and the floating gate consisting of poly one layer 232 and poly two layer 233 for the cell on the right side of the figure are essentially mirror images. This allows for extension of the floating gate out over the drain diffusion regions in the drain-source-drain configuration, without shorting over the shared source diffusion region substantially.

The cell technology and layout has a number of merits. The tunnel oxide is grown before the array source/drain implant. Thus, oxide thickening and dopant depletion effects are minimized. The source and drain implant of the memory cell is self-aligned to the poly one pattern. Thus, the channel length of the cell can be well controlled.

There is a relaxed metal design rule can be used with the flash array, particularly in the architecture of FIG. 3. The source block transistor merges with the memory cell source/ drain diffusion in the cell layout. This overlap region provides interconnection between these two diffusion areas. The field oxide is used to isolate the bit line pairs from neighboring bit lines. Inside the bit line pair, the structure is flat.

Also, for the cell illustrated in FIGS. 5A–5H, the effective gate coupling area seen from the control gate is determined by the area of the second layer of poly. Therefore, a reasonably high gate coupling ratio can be achieved by extending the second layer of poly over the buried diffusion or field oxide regions to compensate for the low gate coupling ratio which would be provided by only the first layer of poly. Further, by extending the length of the extension of the second layer of poly out over the diffusion regions and isolation regions, different gate coupling ratios can be easily achieved to meet different product applications.

An alternative cell structure is illustrated with respect to FIGS. 6A–6G. This structure begins with the same manufacturing steps as shown in FIGS. 5A–5D above. Thus, as can be seen in FIG. 6A, the sequence proceeds from the structure of FIG. 5D by first removing the masks 206 and 207, and then depositing a nitride layer 250 over the region. The nitride layer coats the sides of the floating gate poly 204 as illustrated in the figure.

In the next step, as shown in FIG. 6B, an anisotropic etch is used to remove the deposited nitride layer 250, except for those portions of the layer on the top and sides of the floating gate poly 204.

The etch may leave a small amount of nitride on the edges of the field oxide regions 201, 202. However, this is not important to the process.

After the anisotropic etch of the nitride, the wafer is annealed to drive-in the dopants to form the drain diffusion regions 213 and 214 and the source diffusion region 215. Also, the thermal oxides 216, 217, and 218 are grown over the drain diffusion regions and the source diffusion region, respectively. The nitride layers 205 and 250 protect the floating gate poly 204 from oxide formation.

In the next step, as shown in FIG. 6C, the nitride remnants of the layer 205 and the layer 250 are removed from the structure, exposing the poly one floating gate elements 204.

In the next step, as shown in FIG. 6D, a second poly deposition 219 is deposited on the structure. This second layer poly 219 is deposited to a thickness of about 1,500 to 2,000 angstroms and implanted with an n-type dopant.

As shown in FIG. 6E, poly spacers 240 and 241 are formed along the edges of the poly one pattern using a self-aligned plasma etching of the poly two layer.

During following high temperature steps, the n-type dopants in the poly two deposition will distribute evenly between the poly one and poly two elements, and provide good electrical contact.

As illustrated in FIG. 6F, an ONO layer 220 is deposited over the floating gate structures formed of the poly one element, 242, and the poly two spacers 240 and 241. Also, a region of polysilicon 243 may be left adjacent the field oxide region 201 in this process. However, there is no electrical contact in this region and it should not have an affect on the operation of the device. After deposition of the ONO layer 220, a third poly layer 221 is deposited having a thickness of about 2,500 angstroms to form the word lines for the device.

FIG. 6G illustrates the last step in the process of depositing a layer of tungsten silicide 234 having a thickness of about 2,000 angstroms over the poly three word line 221 to improve the conductivity of the structure.

FIG. 6G is also an approximate scale sketch of the structure. Thus, as can be seen, the drain diffusion regions 213 and 214 are formed in a region between a field oxide 202 and the floating gate 204 of about 0.6 microns in width. The floating gate poly one deposition 204 is about 0.15 microns in thickness. Also the source diffusion region 215 formed between the poly one floating gates is about 0.6 microns in this embodiment. The narrower source diffusion region 215 as compared to that of FIG. 5H, is possible in this approach because of the self-aligned nature of the poly two spacers 240 and 241. There is no need in a layout of a structure as shown in FIG. 6G to provide for mask misalignment tolerances necessary for aligning the mask to form the poly two floating gate extensions of FIG. 5H. This makes the structure of FIG. 6G scalable, as process dimensions shrink, without requirement for allowing for mask misalignment tolerances.

The thicknesses of the regions in the vertical dimensions are similar to those of FIG. 5H. However, the poly one deposition 242 is about 1,500 to 1,600 angstroms thick. The spacers 240 and 241 extend about 2,000 angstroms out over the source and drain diffusion regions.

In an alternative process for making a structure such as shown in FIG. 6G, the second nitride layer 250 is not deposited. However, during the anneal step of FIG. 6B, oxide will grow on the side of the poly one deposition. These oxides on the sides of the poly can be etched away, so that contact between poly one and poly two may be provided in the subsequent steps. However, the etching of the oxide on the side of the poly one portion of the floating gate, will risk etching of the oxide between the floating gate and the substrate. If this region is etched too far, then a short may occur during the poly two deposition to the substrate. Thus, the procedure illustrated in FIG. 6A–6G may be preferred for many applications.

The polysilicon used in the described structure for the floating gate can be replaced with amorphous silicon.

For a better understanding of the layout of the integrated circuit according to the present invention, FIGS. 7–14 are used to describe the layout of a test array which is 6 columns by 3 word lines in size. FIG. 7 is a composite view which will be understood better with reference to the layout views of FIGS. 8–14. As can be seen in FIG. 7, the test array includes five field isolation regions 400, 401, 402, 403, and 404. The layout of these isolation regions can be seen with reference to FIG. 8 where the field oxide regions are marked with reference numerals 400–404, and the hatched region 405 corresponds to an active region inside the p-type well 199 of FIG. 5G.

Figure 9:
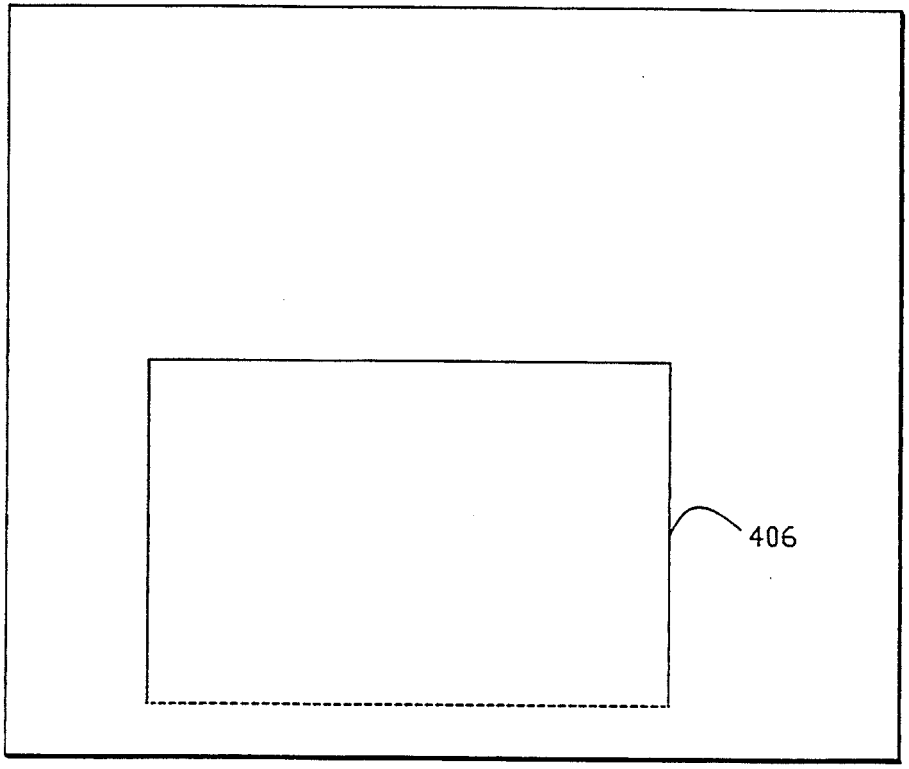

FIG. 9 illustrates the layout of a p-type implant which is used to raise the threshold voltage VT of the memory cells. The implant in area 406 causes a higher initial VT for the memory cells in the block than for the select transistors (in regions circled by lines 436 and 437 of FIG. 7).

The array also includes the poly three control lines 407 and 408 for the right and left select transistors for each of the three segments, respectively. FIG. 7 also shows three word lines 409, 410, and 411 which overlay three segments of the array. The first layer poly is illustrated in FIG. 7 by the bold outline 415 and is also more clearly seen in FIG. 10. There are segments 416, 417, 418, 419, 420, and 421 in the first layer poly, as illustrated in FIG. 10, used for self-alignment of the left and right select transistors. These segments are later removed, after formation of the source and drain regions of the cells. Thus, FIG. 10 illustrates the masking for the poly one deposition. Poly one is deposited and etched inside the region defined by the line 415, and in the regions surrounding the layout on FIG. 10, to establish the first layer poly of the floating gates of FIG. 5G.

FIG. 11 illustrates the masking pattern for the second layer poly for the cell illustrated in FIG. 5G. Regions 412, 413, and 414 are apparent in FIG. 7. Regions 422 and 423 correspond to segments of the floating gate poly over the field isolation areas 401 and 403 of FIG. 7. Poly two is later patterned to establish the extended floating gate of FIG. 5G.

Figure 12:
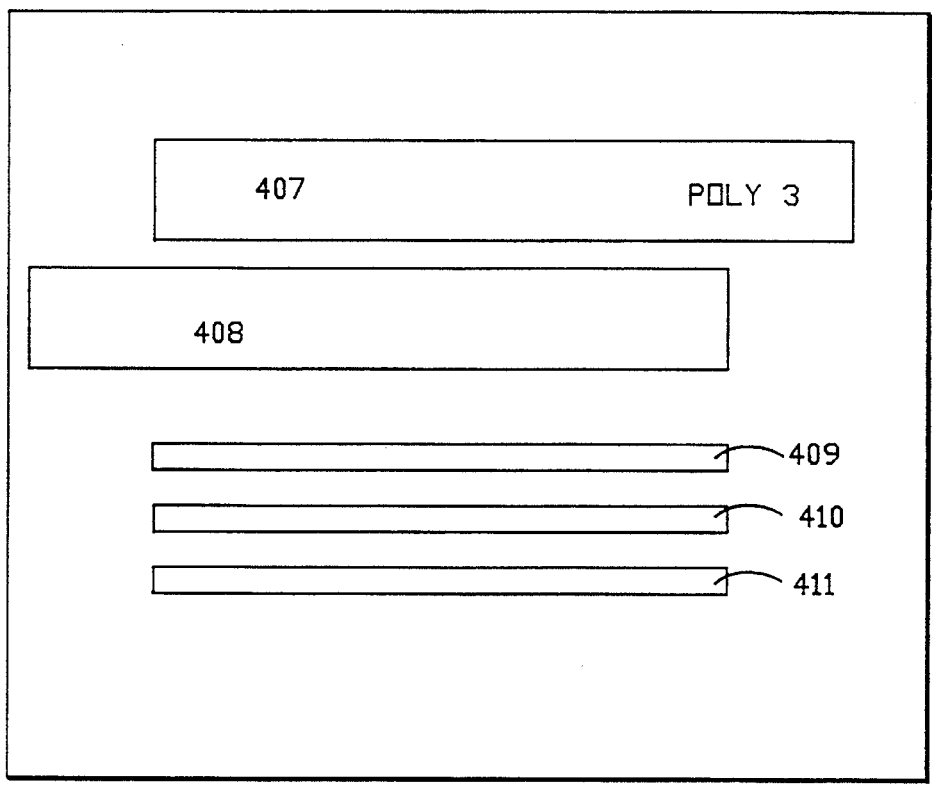

FIG. 12 illustrates the layout of the poly three control lines 407 and 408 and the word lines 409, 410, and 411.

Figure 13:
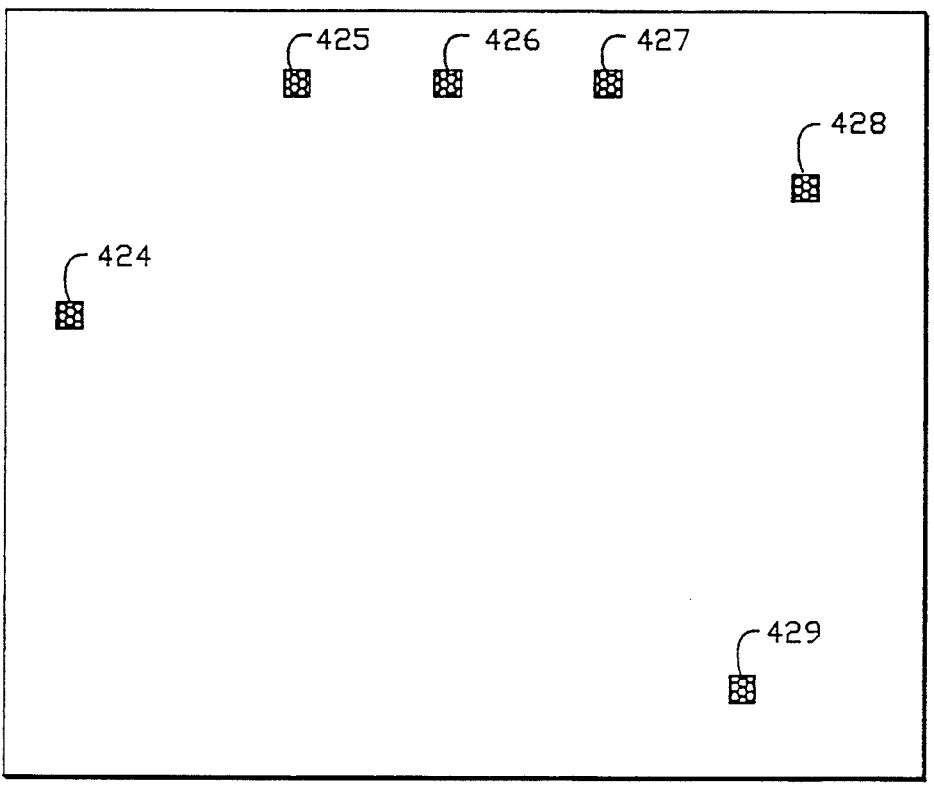

FIG. 13 illustrates the metal contacts 424, 425, 426, 427, 428, and 429 in the test array. The contact 424 is used to contact the poly three control line 408. The contact 428 is used for making a metal contact to the poly three control line 407. Contacts 425, 426, and 427 are used for making contact from the diffusion region of the select transistors to the metal global bit lines which overlay the array (not shown in FIG. 7). Contact 429 is used for making contact to the array source diffusions. The layout of the metal lines is shown in FIG. 14. As can be seen, they align with the contacts 425, 426, and 427 and overlay the segments in the array. Thus, metal bit line 430 is coupled to contact 425, metal bit line 431 is coupled to contact 426 and metal bit line 432 is coupled to contact 427. The metal pads 433 and 434 are coupled to contacts 428 and 424, respectively. The metal pad 435 is coupled to contact 429.

Figure 8:
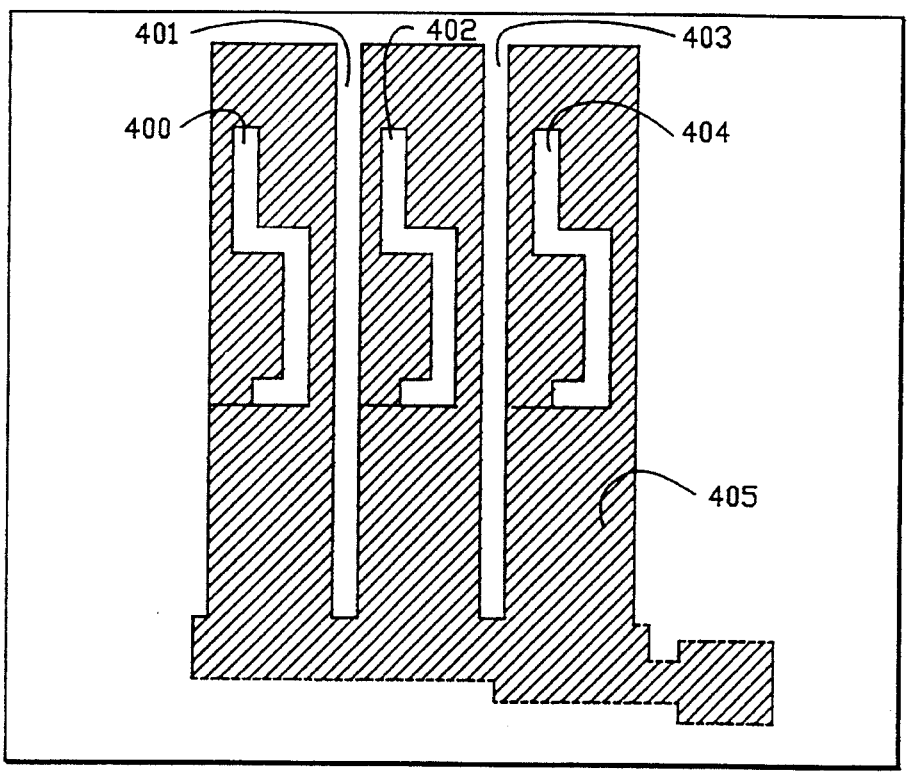

Thus, in the sequence a field isolation and diffusion step is shown in FIG. 8. Next, a VT enhancement implant step is carried out in the region 406 shown in FIG. 9. Next, the floating gate poly is laid down. In addition, the segments 416 through 421 are laid down with poly one to establish the channels for the left and right block select transistors. Then a source/drain implant is executed to form the drain-source-drain structure and the buried diffusions for the left and right block select transistors and the virtual ground terminal. After this implant, the poly two is deposited, as illustrated in FIG. 11. Poly two is patterned as described above to establish the extended floating gates. An insulating layer is placed over poly two and the third layer of poly is deposited with a pattern as shown in FIG. 12. Finally, isolation is deposited over the poly three layer, the metal contacts are made, and the metal bit lines are deposited overlaying the array.

As can be seen in FIG. 7, the left select transistor underlies the control line 408 in the region circled by line 436. Similarly, the right select transistor for the first segment underlies the control line 407 in the region circled by line 437. The contact 425 reaches a diffusion region 438. The diffusion region 438 is isolated from a diffusion region 439 by the masked area 440 which was defined by the poly one deposition. Similarly, the diffusion region 438 is isolated from diffusion region 441 by the masked area 442 which was masked by the poly one deposition. Thus, a select transistor for the left column is established across the channel defined by region 442. The diffusion region 441 is within or coupled to the drain diffusion region for the segment. Similarly, the diffusion region 439 is within or coupled to the right side drain diffusion region for the segment.

The current path from the contact 425 to the left diffusion region for the segment is illustrated by the arrow line 443. As can be seen, this path is interrupted by the transistor channel in the region 442. Thus, the control line 408 provides for connection of the left drain diffusion region to the contact 425.

The current path for the right block select transistor is illustrated by the arrow line 444. As can be seen, this path is interrupted by the channel in the region 440. The two select transistors in the regions 436 and 437, thus provide for selective connection of the contact 425 to either the left or right diffusion region. This way, two columns of flash EPROM cells are selectively coupled to a single metal bit line via contact 425.

As will be appreciated by those skilled in the art, the mask sequence of FIGS. 8–14 will be altered for the cell illustrated in FIG. 6H as concerns the poly 2 deposition steps. However, the basic layout of the array remains unchanged.

Accordingly, a new flash EPROM cell and array architecture have been provided. The architecture provides for a very dense core array obtained by unique cell layouts, where two adjacent local drain bit lines share one common source bit line. Also, the layout has been optimized to allow use of a single metal line for every two columns of cells in the array. Further, the layout is further reduced by shared word lines, so that the word line driver pitch does not impact the size of the main array. Sector erase is feasible using segmentable architecture of the present invention. Also, row redundancy is available for flash EPROM using this structure. A high performance, reliable flash memory array can be achieved using these technologies.

An n-channel embodiment of the flash EPROM array has been disclosed. Those skilled in the art will recognize that p-channel equivalent circuits can be implemented using techniques known in the art. Furthermore, the architecture has been designed with respect to flash EPROM cells. Many aspects of the architecture may be adapted to a variety of memory circuit arrays.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for fabricating a plurality of floating gate transistors on a substrate, comprising:

forming a floating gate insulating layer over at least a portion of the substrate;

defining a plurality of strips of conductive material in a first layer of conductive material over the floating gate insulating layer;

exposing the substrate to dopants so that the plurality of strips act as a mask and a plurality of doped regions in the substrate are formed between the plurality of strips of conductive material;

annealing the substrate to drive in the dopants in the doped regions to establish buried diffusion regions aligned with the strips of conductive material;

forming a thicker insulator with an insulating material over the buried diffusion regions;

exposing the plurality of strips of conductive material;

depositing a second layer of conductive material over and in with the plurality of strips of conductive material;

etching the second layer of conductive material for a time to form self-aligned conductive spacer lines overlying the thicker insulator over the buried diffusion regions, each conductive spacer line contacting only one of the plurality of strips of conductive material;

forming a control gate insulator over the plurality of strips of conductive material and the conductive spacer lines;

depositing a third layer of conductive material over the control gate insulator; and etching the third layer the conductive spacers, and the plurality of conductive strips to define control gate conductors and floating gates.

2. The method of claim 1, wherein the step of exposing the plurality of conductive strips, includes:

covering the plurality of strips of conductive material with a protective substance before the step of annealing, which prevents formation of an insulating material on the conductive material during the step of annealing; and removing the protective substance before the step of depositing a second layer of conductive material.

3. The method of claim 1, wherein the first and second layers have thicknesses of about T units, and the step of etching the second layer is timed to remove about T units of thickness of the conductive material leaving essentially the plurality of strips formed with the first layer and spacer lines on the sides of the plurality of strips consisting of remnants of the second layer.

4. The method of claim 1, further including:

implanting a dopant in the second layer of conductive material to improve electrical contact between the plurality of strips and the second conductive layer.

5. A method for fabricating a plurality of flash EPROM transistors on a substrate, comprising:

forming a floating gate insulating layer over at least a portion of the substrate;

defining a plurality of strips of polysilicon in a first polysilicon layer over the floating gate insulating layer;

exposing the substrate to dopants so that the plurality of strips act as a mask and a plurality of doped regions in the substrate are formed between the plurality of strips of conductive material;

annealing the substrate to drive in the dopants in the doped regions to establish buried diffusion regions aligned with the strips of polysilicon;

forming a thicker insulator with an insulating material over the buried diffusion regions;

exposing the plurality of strips of polysilicon;

depositing a second polysilicon layer over and in contact with the plurality of strips;

etching the second polysilicon layer for a time to form self-aligned conductive spacer lines overlying the thicker insulator over the buried diffusion regions, each conductive spacer line contacting only one of the plurality of strips;

forming a control gate insulator over the plurality of strips and the conductive spacer lines;

depositing a third polysilicon layer over the control gate insulator; and etching the third layer the conductive spacers, and the plurality of conductive strips to define control gate conductors and floating gates.

6. The method of claim 5, wherein the step of exposing the plurality of conductive strips, includes:

covering the plurality of strips with a nitride before the step of annealing, which prevents formation of an oxide on the polysilicon during the step of annealing; and removing the nitride to expose at least respective portions of the plurality of strips before the step of depositing a second polysilicon layer.

7. The method of claim 5, wherein the first and second polysilicon layers have thicknesses of about T units, and the step of etching the second polysilicon layer is timed to remove about T units of thickness of the polysilicon leaving essentially the plurality of strips formed with the first polysilicon layer and spacer lines on the sides of the plurality of strips consisting of remnants of the second polysilicon layer.

8. The method of claim 5, further including:

implanting a dopant in the second polysilicon layer to improve electrical contact between the plurality of strips and the second polysilicon layer.

9. The method of claim 6, wherein the plurality of strips have respective tops and sides, and the step of covering the plurality of strips with nitride includes forming a first nitride layer after the first polysilicon layer and before defining the plurality of strips, so that the tops of the plurality of strips are covered with the first nitride layer after the step of defining;

forming a second layer of nitride over the plurality of strips which covers the first layer on the tops of the strips, the sides of the strips, and the doped regions; and anisotropically etching the second layer of nitride to expose the doped regions without exposing the tops or the sides of the strips.

10. The method of claim 9, wherein the step of removing the nitride after the step of annealing comprises removing essentially all of the nitride.

* * * * *